United States Patent
Yokogawa et al.

(10) Patent No.: US 6,690,035 B1
(45) Date of Patent: Feb. 10, 2004

(54) SEMICONDUCTOR DEVICE HAVING AN ACTIVE REGION OF ALTERNATING LAYERS

(75) Inventors: Toshiya Yokogawa, Nara (JP); Kunimasa Takahashi, Osaka (JP); Osamu Kusumoto, Nara (JP); Makoto Kitabatake, Nara (JP); Takeshi Uenoyama, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/980,598

(22) PCT Filed: Nov. 20, 2000

(86) PCT No.: PCT/JP00/08155

§ 371 (c)(1),
(2), (4) Date: Nov. 1, 2001

(87) PCT Pub. No.: WO01/67521

PCT Pub. Date: Sep. 13, 2001

(30) Foreign Application Priority Data

Mar. 3, 2000 (JP) ............................................ 2000-058964

(51) Int. Cl.$^7$ ............................................ H01L 31/0312
(52) U.S. Cl. ...................................... 257/77; 257/194
(58) Field of Search ............................... 257/475, 478, 257/77, 96, 195, 194, 196

(56) References Cited

U.S. PATENT DOCUMENTS

| | | | | |
|---|---|---|---|---|
| 3,739,243 A | * | 6/1973 | Semichon et al. | 317/235 |
| 4,882,609 A | | 11/1989 | Schubert et al. | |
| 6,388,272 B1 | * | 5/2002 | Odekirk | 257/77 |

FOREIGN PATENT DOCUMENTS

| | | |
|---|---|---|
| EP | 0 309 290 A | 3/1989 |
| EP | 0612104 A2 | 8/1994 |
| JP | 54-132173 | * 10/1979 |
| JP | 5-13446 | 1/1993 |
| JP | 6-349860 | 12/1994 |
| JP | 9-289216 | 11/1997 |
| WO | WO 01/93339 A1 | 12/2001 |

OTHER PUBLICATIONS

"Characterization of Double Pulse–Doped Channel GaAs MESFET's", Shigeru Nakajima, et al., IEEE Electron Device Letters, vol. 14, No. 3, Mar. 1993, pp. 146–148.

"Stark Effect Studied in ⊕–doped GaAs Structures",. A. Ben Jazia, et al., Semicond. Sci. Technol. 12 (1997), pp. 1988–1395.

"Vertical Hot–Wall Type CVD for SiC Growth", Kunimasa Takahashi, et al., Materials Science Forum Vols. 338–342 (2000), pp. 141–144.

"Electronic Properties of Nitrogen Delta–Doped Silicon Carbide Layers", Toshiya Yokogawa, et al., Mat. Res. Soc. Symp. Proc. vol. 640 (2001), pp. H2.5.1–H2.5.6.

(List continued on next page.)

Primary Examiner—Phat X. Cao
(74) Attorney, Agent, or Firm—Harness, Dickey & Pierce, P.L.C.

(57) ABSTRACT

An active region 30 is formed on a substrate 3, which is made of SiC, GaN, or GaAs, for example, by alternately layering undoped layers 22 with a thickness of for example about 50 nm and n-type doped layers 23 with a thickness (for example, about 10 nm) that is thin enough that quantum effects can be achieved. Carriers spread out into the undoped layers 22 from sub-bands of the n-type doped layers 23 that occur due to quantum effects. In the undoped layers 22, which have a low concentration of impurities, the scattering of impurities is reduced, and therefore a high carrier mobility can be obtained there, and when the entire active region 30 has become depleted, a large withstand voltage value can be obtained due to the undoped layers 22 by taking advantage of the fact that there are no more carriers in the active region 30.

4 Claims, 23 Drawing Sheets

OTHER PUBLICATIONS

Partial Supplementary European Search Report EP 00 97 6350, Dec. 20, 2002.

A. Konstantinov et al., "Investigation of Lo–Hi–Lo and Delta–Doped Silicon Carbide Structures", Mat. Res. Soc. Symp. Proc., vol. 640, 2001, pp. H2.4.1–H2.4.6.

D.W. van der Weide, "Delta–doped Schottky diode nonlinear transmission lines for 480–fs, 3.5–V transients", Applied Physics Letters, vol. 65, No. 7, Aug. 15, 1994, pp. 881–883.

S M Bedair, "Selective–area and sidewall growth by atomic layer epitaxy", Semiconductor Science and Technology, vol. 8, No. 6, Jun. 1, 1993, pp. 1052–1062.

Shui Jinn Wang et al., "Schottky/Two–Dimensional Hole Gas Silicon Barrier Diodes with Single and Coupled Delta–Doped Wells", Jpn. J. Appl. Phys., vol. 33, No. 4B, Part 1, Apr. 1, 1994, pp. 2429–2434.

W.C. Hsu et al., "A Quantum Well ⊕–Doped GaAs Fet Fabricated by Low–Pressure Metal Organic Chemical Vapor Deposition", Solid–State Electronics, vol. 34, No. 6, Jun. 1, 1991, pp. 649–653.

\* cited by examiner

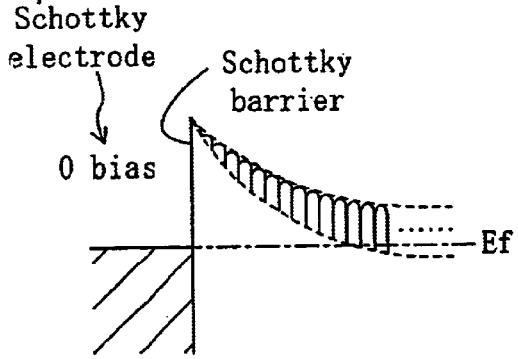
FIG. 7(a1) second embodiment
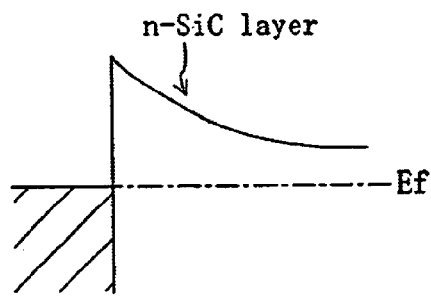
FIG. 7(a2) conventional example
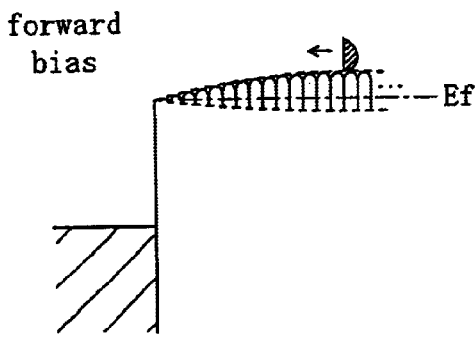
FIG. 7(b1)
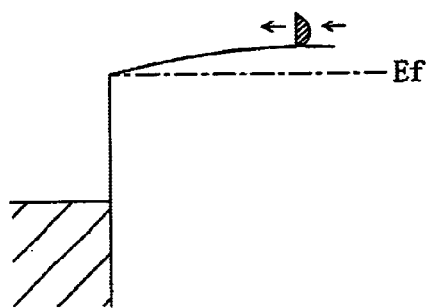
FIG. 7(b2)
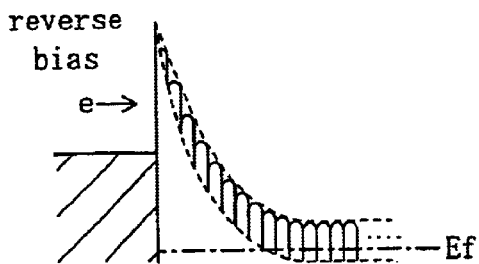
FIG. 7(c1)
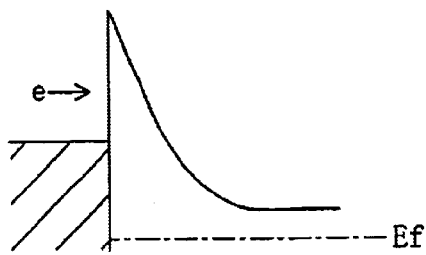
FIG. 7(c2)

FIG. 9(a1)    FIG. 9(a2)    FIG. 9(a3)
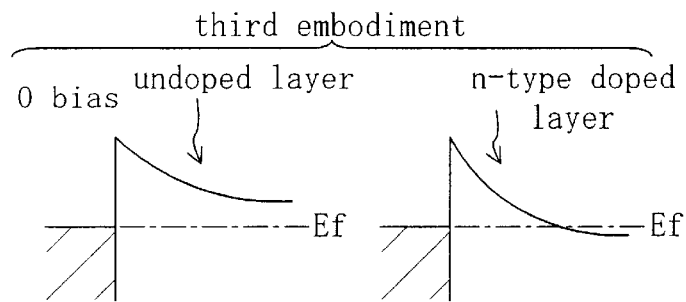
FIG. 9(b1)    FIG. 9(b2)    FIG. 9(b3)
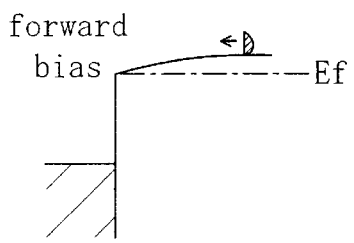 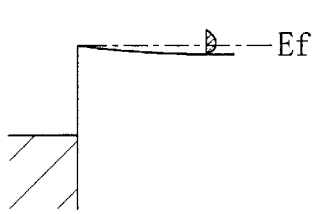 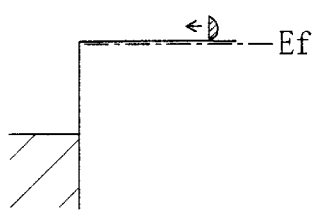
FIG. 9(c1)    FIG. 9(c2)    FIG. 9(c3)
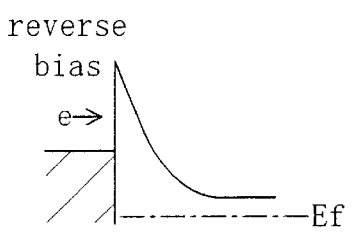 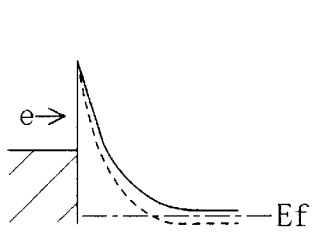 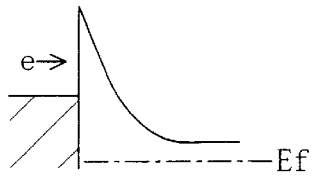

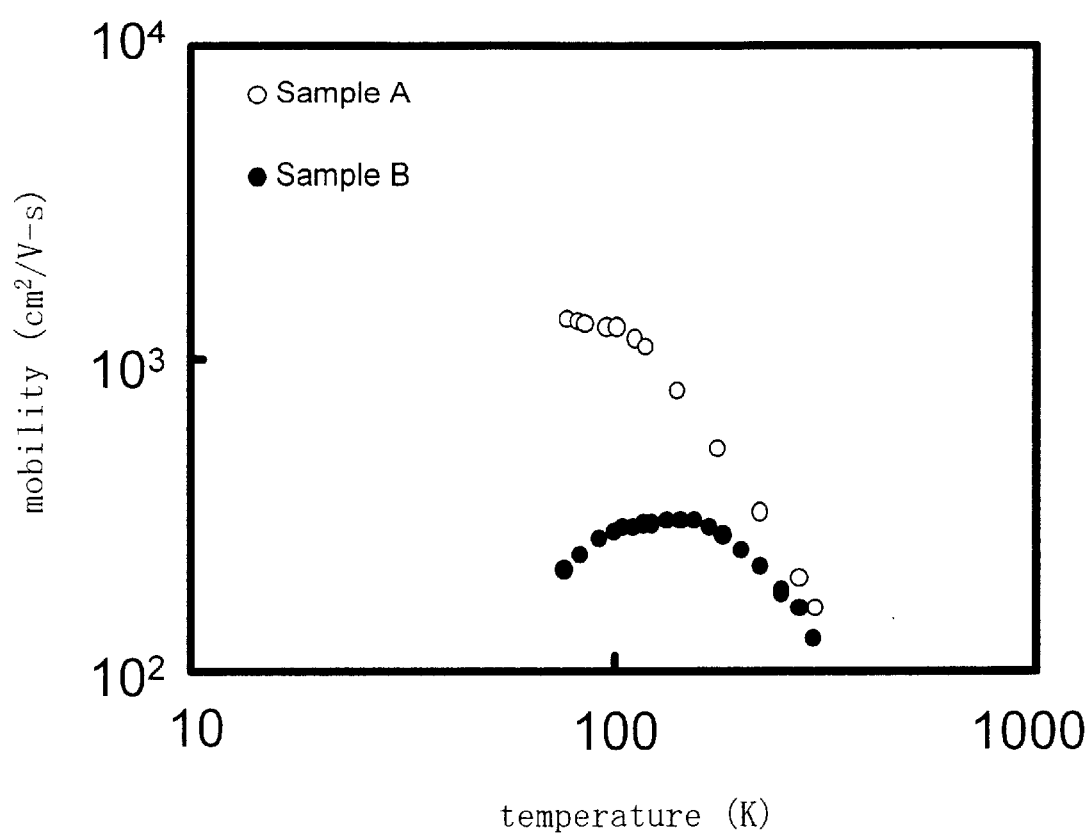

SEMICONDUCTOR DEVICE HAVING AN ACTIVE REGION OF ALTERNATING LAYERS

TECHNICAL FIELD

The present invention relates to the structure of an active region that is particularly suited for semiconductor power devices having a high breakdown voltage.

BACKGROUND ART

In recent years there has been intense development of new semiconductor materials (including so-called semi-insulating materials) for achieving semiconductor devices having special features, such as high-frequency characteristics, light emission characteristics, and withstand voltage characteristics. Among semiconductor materials, those with so-called semi-insulating properties in an intrinsic state, for example silicon carbide (SiC), gallium nitride (GaN), and gallium arsenide (GaAs), have higher hardness and are less susceptible to chemicals than silicon (Si), which is the most typical of semiconductor materials, and because these semiconductors have a large band gap, they have promise for future applications in next-generation power devices, high-frequency devices, and devices operating at high temperature, for example, utilizing their high withstand voltages.

Semiconductor power devices utilizing these wide band gap semiconductor materials include high withstand voltage Schottky diodes, MESFETs (Metal Semiconductor Field Effect Transistors), and MISFETs (Metal Insulator Semiconductor Field Effect Transistors), for example.

An example of a Schottky diode and a MISFET are provided here as conventional examples of a semiconductor power device.

FIG. 11 is a cross-sectional view showing the schematic structure of a conventional Schottky diode using silicon carbide (SiC). As shown in FIG. 11, numeral 101 denotes an n⁺ SiC substrate of approximately 100 μm thickness that has been doped with a high concentration of nitrogen (N), which is an n-type carrier, numeral 102 denotes an n⁻ SiC layer that is approximately 10 μm thick and has been doped to a low concentration of nitrogen (N), which is an n-type carrier, numeral 103 denotes a Schottky electrode made of a Ni alloy, numeral 104 denotes an ohmic electrode made of a Ni alloy, and numeral 105 denotes a guard ring made of $SiO_2$. In this diode, when voltage is applied between the Schottky electrode 103 and the ohmic electrode 104 so that the Schottky electrode 103 has a higher potential than the ohmic electrode 104 (forward voltage), current flows between the Schottky electrode 103 and the ohmic electrode 104, and when voltage is applied between the Schottky electrode 103 and the ohmic electrode 104 so that the ohmic electrode 104 has a higher potential than the Schottky electrode 103 (reverse voltage), current does not flow between the Schottky electrode 103 and the ohmic electrode 104. That is, this Schottky diode has a rectification characteristic that allows current to flow in accordance with forward voltage, but blocks current with respect to reverse voltage.

PROBLEMS SOLVED BY THE INVENTION

However, there were the following problems with the above-described conventional Schottky diode.

Withstand voltage properties with respect to reverse voltage in the above-described conventional Schottky diode are highly dependant on the doping concentration in the n⁻ SiC layer 102. For example, to improve the withstand voltage of the Schottky diode, the doping concentration of the n⁻ SiC layer 102 in contact with the Schottky electrode 103 must be kept at a low level. However, because the resistivity of the n⁻ SiC layer 102 rises when the doping concentration is lowered, the on-resistance when forward voltage is applied becomes higher. The result is that power consumption increases. Because of this trade-off, it was difficult to simultaneously achieve a high withstand voltage and a low resistivity.

It is known that these problems occur not only in Schottky diodes but in MESFETs and MISFETs as well.

DISCLOSURE OF THE INVENTION

An object of the present invention is to achieve an active element having a high withstand voltage and low on resistance by creating a new structure for solving trade-offs such as those in the above-described conventional power devices.

The semiconductor device of the present invention is made by providing, on a substrate, an active region that functions as a portion of an active element, wherein the active region is configured by layering at least one first semiconductor layer which is provided on the substrate, and which functions as a carrier transit region; and at least one second semiconductor layer which includes a higher concentration of impurities for carriers than the first semiconductor layer, which has a thinner film thickness than the first semiconductor layer, and from which carriers can migrate to the first semiconductor layer due to quantum effects.

With this structure, quantum states occurs in the second semiconductor layer due to quantum effects, and the wave function of carriers that are localized in the second semiconductor layer comes to have a certain degree of widening. This results in the diffusion of carriers, such that carriers are not only present in the second semiconductor layer but also as the first conductor layer. Then, when the potential of the active region is increased and the carriers move, the carriers are continually supplied to both the second and the first semiconductor layers, and therefore the carriers are distributed such that they are always present in not only the second semiconductor layer but in the first semiconductor layer as well. In this state the carriers move not only through the second, but also through the first semiconductor layer, and thus the resistance value of the active region is reduced. In particular, because the scattering on impurity ions becomes smaller in the first semiconductor layer, a particularly high carrier mobility can be attained.

On the other hand, in a state wherein the entire active region has become depleted, carriers are no longer present in the active region, and therefore the withstand voltage properties depend on the first semiconductor layer, which has a low concentration of impurities, and over the entire active region a high withstand voltage value is obtained. This means that it becomes possible to simultaneously achieve low resistance and high withstand voltage of active elements, such as diodes and transistors, within semiconductor devices.

It is preferable that the first and second semiconductor layers are each provided in plurality and are layered in alternation. Thus, it is possible to more reliably achieve a low resistance value and high withstand voltage properties.

It is preferable that the concentration of impurities for carriers in the first semiconductor layer is below $1 \times 10^{17}$ atoms·cm⁻³, and that the concentration of impurities for carriers in the second semiconductor layer is at least $10^{17}$ atoms·cm⁻³.

It is preferable that the substrate and the active region are made of one material selected from SiC, GaN, and GaAs. Thus, it is possible to achieve a semiconductor device which has a structure suited for a power device in which materials having a wide band gap are used.

It is preferable that the first and second semiconductor layers in the active region are made of the same material. Thus, the potential barrier between the first semiconductor layer and the second semiconductor layer has an even smoother slope, and therefore it becomes easy for the carriers to be distributed across the first and second semiconductor layers in the active region.

It is preferable that if the second semiconductor layer is a SiC layer, the thickness of the second semiconductor layer is at least one monolayer and below 20 nm. Thus, in an operating state it becomes possible to effectively attain the migration of carriers into the first semiconductor layer.

It is preferable that if the first semiconductor layer is a SiC layer, then the thickness of the first semiconductor layer is at least about 10 nm and at most 100 nm. Thus, in an operating state, a certain amount of current can be secured.

It is preferable that the substrate is a semiconductor layer that includes a high concentration of impurities, that the uppermost portion of the active region is made of the first semiconductor layer, and that the semiconductor device further comprises a Schottky electrode providing a Schottky contact with a portion of the upper surface of the first semiconductor layer at the upper most portion of the active region, and an ohmic electrode providing an ohmic contact with a portion of the substrate. Thus, by taking advantage of the aforementioned characteristics of the active region, it is possible to obtain a vertical-type Schottky diode which is capable of simultaneously attaining a low resistivity during operation and a high withstand voltage value with respect to a reverse bias.

It is preferable that the semiconductor device further includes a Schottky electrode providing a Schottky contact with a first lateral face of the first semiconductor layer and of the second semiconductor layer of the active region, and an electrode that is connected to a second lateral face of the first semiconductor layer and of the second semiconductor layer of the active region, the second lateral face being arranged at a certain spacing from the first lateral face. Thus, by taking advantage of the aforementioned characteristics of the active region, it is possible to obtain a horizontal-type Schottky diode which is capable of simultaneously attaining a low resistivity during operation and a high withstand voltage value with respect to a reverse bias.

In the above case, it is preferable that the semiconductor device has a structure that further includes a doped layer for connecting lead, which is formed by introducing a high concentration of impurities into a region of the active region that is at a certain spacing from the first lateral face of the first semiconductor layer and the second semiconductor layer, and wherein the electrode is in ohmic contact with the doped layer for connecting lead.

It is preferable that the uppermost portion of the active region is made of the first semiconductor layer, and that the semiconductor device further comprises a Schottky gate electrode, which is in Schottky contact with a portion of the upper surface of the first semiconductor layer at the uppermost portion of the active region, and source and drain electrodes, which are provided on the active region and sandwich the Schottky gate electrode, and which are connected to the active region. Thus, taking advantage of the aforementioned characteristics of the active region, it is possible to attain a MESFET that is capable of achieving low power consumption, a high withstand voltage, and a high gain.

In that case, it is preferable that the semiconductor device has a structure which further includes two third semiconductor layers, which are provided on the active region and sandwich the Schottky gate electrode, and which include a high concentration of impurities,. and that the source and drain electrodes are in ohmic contact with the third semiconductor layers. Thus, it is possible to achieve a MESFET that has a recessed gate. structure.

BRIEF DESCRIPTION OF THE DRAWINGS

FIGS. 7(a1) to 7(c2) are energy band diagrams showing the change in shape of the conduction band edge due to bias changes, for the Schottky diode of the second embodiment and for a conventional Schottky diode.

FIGS. 9(a1) to 9(c3) are energy band diagrams showing the change in shape of the conduction band edge due to bias changes, for the Schottky diode according to the third embodiment of the present invention and for a conventional Schottky diode.

FIG. 16 is a graph illustrating the temperature dependency of electron mobility in sample A and sample B according to the first experimental example.

BEST MODE FOR CARRYING OUT THE INVENTION

Figure 1:
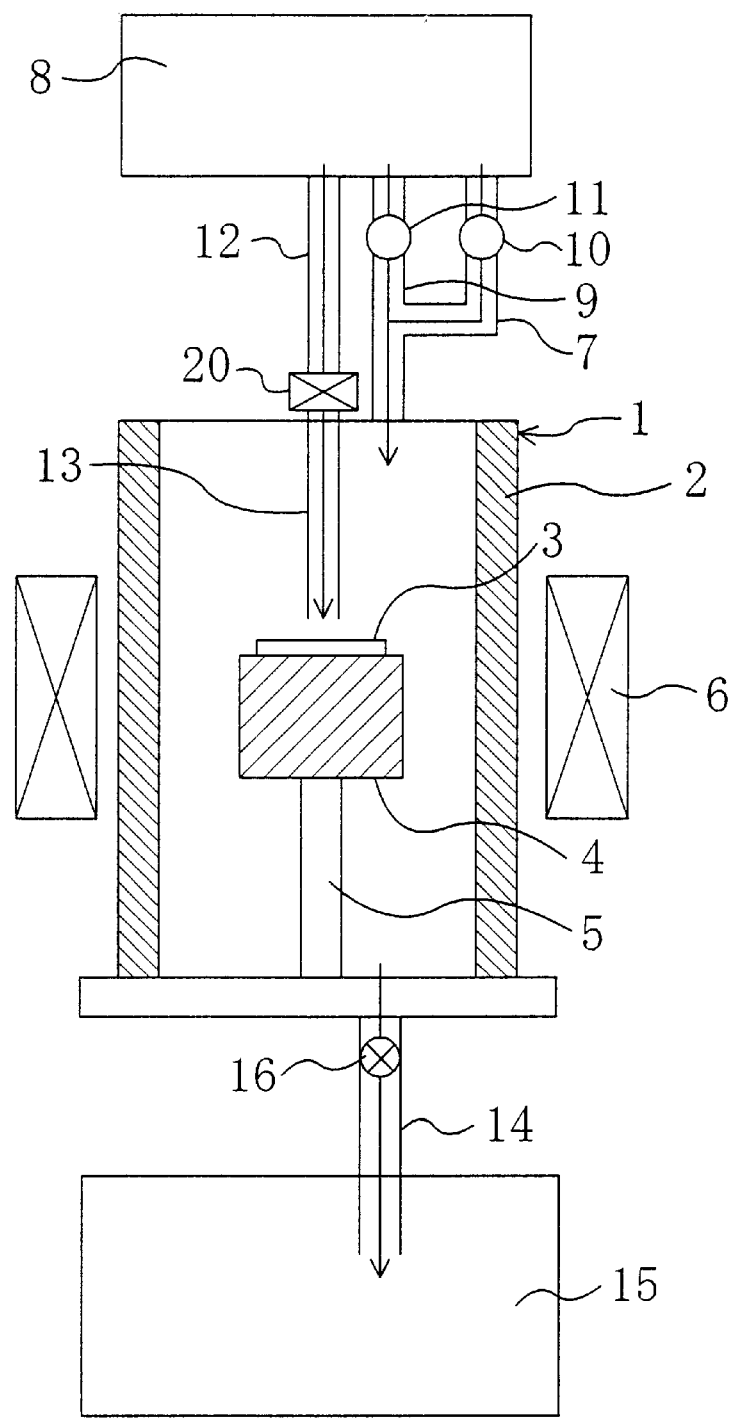
FIG. 1 is a diagram schematically showing the structure of a crystal growth apparatus for forming a thin film, which is used in the embodiments of the present invention.

FIG. 1 is a diagram that schematically shows the structure of a crystal growth apparatus for forming a thin film, which is used in the embodiments of the present invention.

As shown in FIG. 1, this vertical-type crystal growth apparatus includes, in a chamber 1, a susceptor 4 made of carbon for mounting a substrate 3, a support shaft 5 for supporting the susceptor 4, a quartz tube 2 of the chamber 1, and a coil 6 that is wrapped around the outside of the quartz tube 2 and is for induction heating the susceptor 4 with a high-frequency current. The quartz tube 2 is made of a double quartz tube, for example, and is configured such that it allows coolant to flow. Additionally, the apparatus is provided with a gas supply system 8 in which for example various gas cylinders are arranged for supplying gas to the chamber 1, and a gas exhaust system 15 in which a vacuum pump, for example, for discharging the various gases from the chamber 1 is disposed. The gas supply system 8 and the chamber 1 are connected by a source gas supply pipe 7 for supplying source gas, a dilution gas supply pipe 9 for supplying dilution gas such as hydrogen, and an additive gas supply pipe 12 for supplying additive gas such as inert gas or doping gas, and the source gas supply pipe 7 and the dilution gas supply pipe 9 merge at an intermediate location before connecting to the chamber 1. Also, flowmeters 10 and 11 for adjusting the gas flow rate are provided in the source gas supply pipe 7 and the dilution gas supply pipe 9, respectively, at locations before the two pipes merge. Furthermore, the gas exhaust system 15 and the chamber 1 are connected by an exhaust pipe 14, and a pressure adjustment valve 16 for adjusting the pressure in the chamber 1 depending on the flow rate of the discharged gas is installed in the exhaust pipe 14.

Here, special features of the crystal growth apparatus are that a pulse valve 20 is installed in the additive gas supply pipe 12, and that a gas introducing pipe 13 of an approximately 2 cm diameter extends from the tip of the additive gas supply tube 12 into the chamber 1, the tip of the gas introducing pipe 13 opening up at a location that is approximately 5 cm above the upper surface of the substrate 3.

The susceptor 4 is coated with an approximately 100 μm thick SiC film so that outgassing does not occur during heating at elevated temperatures. The thickness of this SiC film should be given at least a thickness at which the occurrence of outgassing can be prevented.

After the combination of the source gas, which is supplied by the gas supply system 8 and passes through the source gas supply pipe 7, and the dilution gas, which is supplied by the gas supply system 8 and passes through the dilution gas supply pipe 9, those gases are introduced into the chamber 1 from the top of the chamber 1. At that time, the flow rate of the source gas and the dilution gas is adjusted by the flowmeters 10 and 11.

On the other hand, the additive gas, for example doping gas or inert gas, passes through the additive gas. supply pipe 12 and is supplied to the surface of the substrate 3 in pulses corresponding to the periodic opening and closing of the pulse valve 20. The period during which the pulse valve 20 is open (pulse width) and the period during which it is closed (interval between pulses) can be freely set, and for example when the pulse valve 20 is open for a period of 100 μs (μsec) and closed for a period of 4 ms (msec), the valve repeatedly opens and closes approximately 240 times per second. Although it is preferable that the tip of the gas introducing pipe 13 and the substrate 3 are close to one another, if they are too close the gas can be effectively supplied in pulses only to a narrow area, and therefore it is preferable that the distance between the two is about 5 cm.

Moreover, the source gas, the dilution gas, and the additive gas are passed through the exhaust pipe 14 and discharged to the outside by the gas exhaust system 15.

Figure 2:
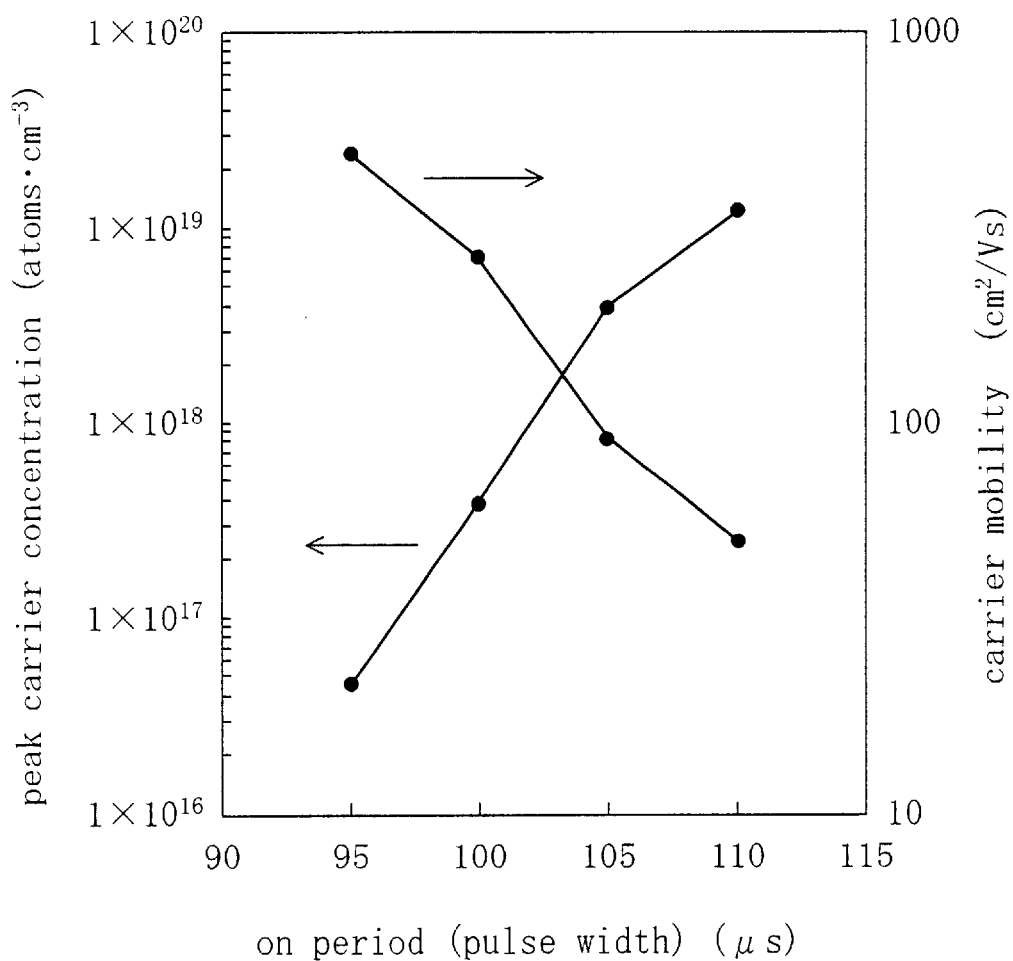
FIG. 2 is a diagram showing the change in the peak carrier concentration and carrier mobility of the n-type doped layer when the pulse width is changed.

FIG. 2 is a graph showing the change in the peak carrier concentration ($cm^{-3}$) and the carrier mobility ($cm^2/Vs$) of the n-type doped layer when changing the on period (pulse width) during which the pulse valve is open. At this time, the secondary pressure of the decompressor of the gas cylinder in the gas supply system 8 was held constant at 78,400 Pa (0.8 $kgf/cm^2$). Additionally, the on period during which the pulse valve 20 is open is changed, but the off period (interval between pulses) during which the pulse valve 20 is closed was held constant at 4 ms.

As shown in FIG. 2, the peak carrier concentration of the n-type doped layer can clearly be controlled by changing the on period during which the pulse valve 20 is open. From these results it can be seen that the peak carrier concentration can be adjusted even if the off period is changed. In particular, when the off period (interval between pulses) remains constant, simply by varying the on period (pulse width) of the pulse valve between 95 μs and 110 μs, the peak carrier concentration can be significantly varied from $5 \times 10^{16}$ $cm^{-3}$ to approximately $1 \times 10^{19}$ $cm^{-3}$.

First Embodiment

Figure 3A:
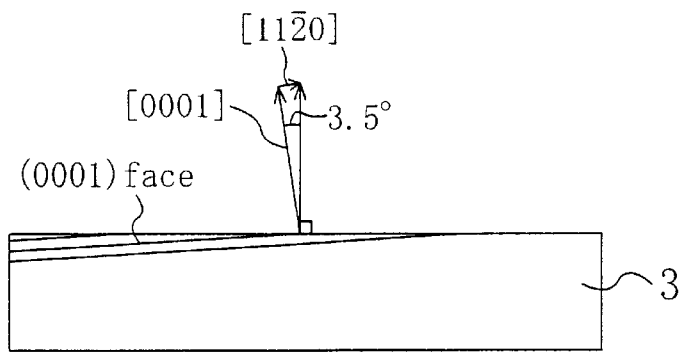
FIGS. 3(a) to 3(c) are cross-sectional views showing the method for growing a semiconductor film according to the first embodiment of the present invention.
Figure 3B:
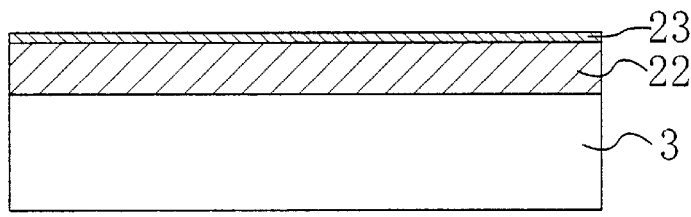
Figure 3C:
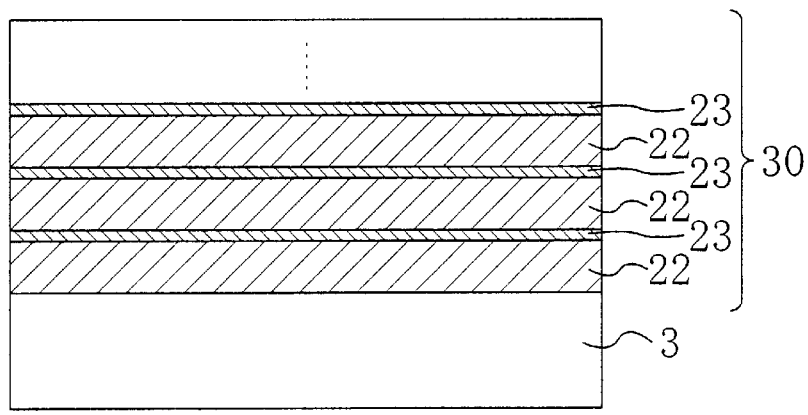

As a first embodiment, a method is described for homoepitaxial growth of an n-type doped layer made of hexagonal silicon carbide (SiC) on the substrate 3 using the crystal growth apparatus shown in FIG. 1, and using a hexagonal single-crystal silicon carbide substrate (6H—SiC substrate) having a principal face provided with an off angle on the (0001) face (C face) as the substrate 3 of FIG. 1. FIGS. 3(a) to 3(c) are cross-sectional views showing the method for growing a semiconductor film according to the present embodiment.

As shown in FIG. 3(a), the principal face of the substrate 3 (6H—SiC substrate) is a face ((0001) off face) with a 3.5° tilt in the [11–20] direction from the (0001) face (C face), and is an n-type Si face in which the Si atoms are lined up in the surface. The diameter of the substrate 3 is 25 mm. First, the substrate 3 is subjected to thermal oxidation for three hours at 1110° C. in a water vapor atmosphere through which oxygen is bubbled at a flow rate of 5 (l/min), and once a thermal oxide film of approximately 40 nm thickness is formed on the surface, the thermal oxide film is removed by buffered hydrofluoric acid (hydrofluoric acid:ammonium fluoride aqueous solution=1:7). The substrate 3 from which the thermal oxide film has been removed from its surface is placed on the susceptor 4, and the pressure in the chamber 1 is reduced until it reaches a vacuum degree of about $10^{-6}$ Pa ($\cdot 0.10^{-8}$ Torr).

Next, with the process shown in FIG. 3(b), hydrogen gas with a flow rate 2 (l/min) and argon gas with a flow rate 1 (l/min) are supplied as dilution gases from the gas supply system 8, and the pressure in the chamber 1 is set to 0.0933 MPa (700 Torr). The pressure in the chamber 1 is controlled by the opening of the pressure adjustment valve 16. While the flow rates are maintained, an induction heating device is used to apply a high-frequency voltage of 20.0 kHz and 20 kW to the coil 6 to heat the susceptor 4. The temperature of the substrate 3 is controlled to a constant temperature of approximately 1600.C. While the flow rates of the hydrogen gas and the argon gas are held at the above-mentioned constant values, propane gas ($C_3H_8$) with a flow rate of 2 (ml/min) and silane gas ($SiH_4$) with a flow rate of 3 (ml/min) are introduced into the chamber 1 as source gases. The source gases are diluted by hydrogen gas with a flow rate of 50 (ml/min). Then, by supplying propane gas and silane gas to the substrate 3 (6H—SiC substrate) on the induction heated susceptor 4, an undoped layer 22 (low-concentration doped layer) of approximately 50 nm thickness made of undoped 6H—SiC single crystal is epitaxially grown on the (0001) off face, that is, the principal face of the substrate 3. Because at this time impurities for carriers such as nitrogen may be introduced to a certain extent by remanent gas, for example, even if nitrogen gas, for example, is not used, the term "undoped layer" will be used throughout this and the following embodiments to refer to layers in which nitrogen has not been introduced consciously during the fabrication process.

By supplying the n-type doping gas of nitrogen in pulses to the chamber 1 while continuing to supply the source and dilution gases, an n-type doped layer 23 (high-concentration doped layer) of approximately 10 nm thickness is formed on the undoped layer 22. At this time, by repeatedly opening and closing the pulse-valve 20 while the source and dilution gases are being supplied, it is possible to supply doping gas in pulses from the introducing pipe 13 directly onto the substrate 3 within the chamber 1. In the present embodiment, the period during which the pulse valve 20 is open (pulse width) has been set to 102 μs, and the period during which the pulse valve 20 is closed (interval between pulses) has been set to 4 ms. Moreover, the n-type doped layer 23 is formed by repeatedly opening and closing the pulse valve 20 while the doping gas is being supplied. At this time, approximately seconds are required for the epitaxial growth of the 10 nm thick n-type doped layer 23.

Next, with the process shown in FIG. 3(c), by further repeating the process of closing the pulse valve 20 to stop the supply of nitrogen (N) and form an undoped layer 22 by supplying only the source gas, and then opening and closing the pulse valve 20, while simultaneously supplying the source gas, to introduce nitrogen (N) to form an n-type doped layer 23, an active region 30 is formed by alternately layering undoped layers 22 and n-type doped layers 23.

This means that the active region 30 is formed by alternately layering the undoped layers 22 that are first semiconductor layers, and the n-type doped layers 23 that are second semiconductor layers, which are not as thick as the undoped layers and include impurities for carriers at a concentration higher than that of the undoped layers 22 (first semiconductor layers), and which are thin enough that carriers migrate into the undoped layers 22 due to quantum effects.

Figure 4:
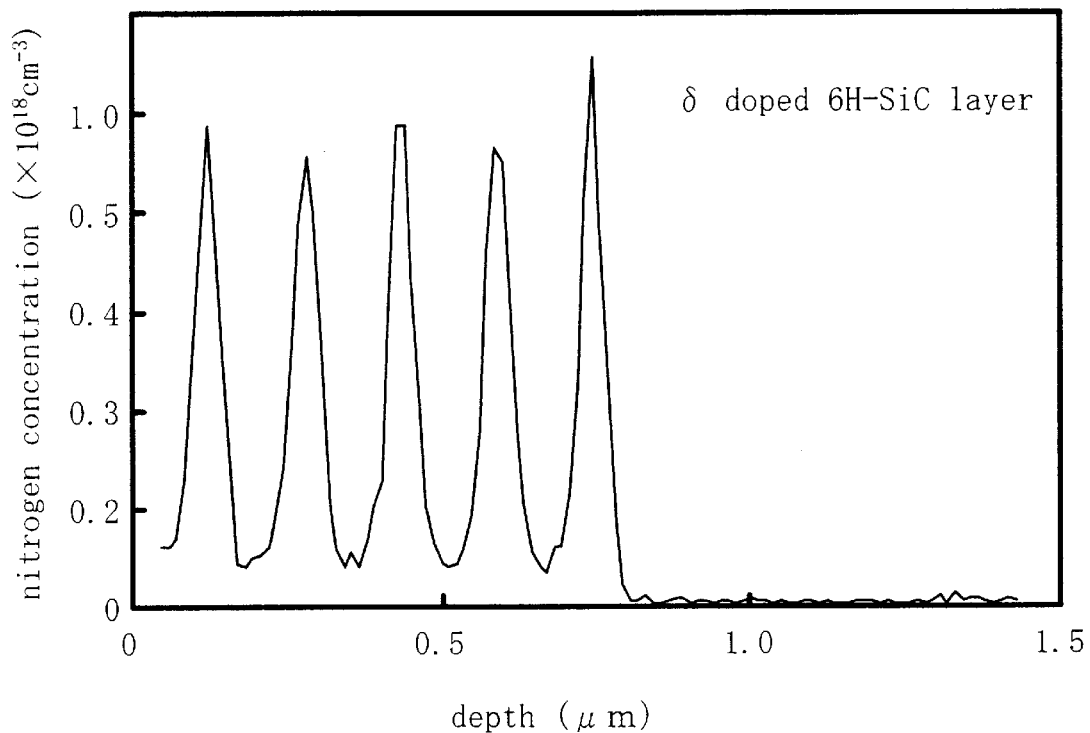
FIG. 4 is a diagram showing the distribution of the dopant concentration in the depth direction of the active region that is formed in the first embodiment of the present invention.

FIG. 4 is a diagram showing the dopant concentration distribution in the depth direction of the active region 30 that is formed in the present embodiment. As mentioned above, during formation of the n-type doped layers 23, the pulse valve 20 is set to be open for a period (pulse width) of 102 μs, and closed (interval between pulses) for a period of 4 ms. The concentration profile in FIG. 4 was obtained from the result of measurements made using secondary ion mass spectrometry (SIMS). In the diagram, the horizontal axis represents depth (in μm) from the upper surface of the substrate, and the vertical axis represents concentration (in atoms·cm$^{-3}$) of the nitrogen dopant. As shown in the diagram, the concentration of nitrogen (N) in the n-type doped layers 23 that were formed using the method of the present embodiment is substantially uniform (at approximately $1\times10^{18}$ atoms·cm$^{-3}$), and both the transition regions in which the undoped layers 22 change into the n-type doped layers 23, and the transition regions in which the n-type doped layers 23 change into the undoped layers 22, show an extremely sharp change in impurity concentration. The data of FIG. 4 were obtained for doped layers formed while nitrogen gas, as the carrier gas, was flowed when the pulse valve 20 was open for a period (pulse width) of 102 μs, and therefore the peak concentration of nitrogen shown in FIG. 4 is about $1\times10^{18}$ atoms·cm$^{-3}$, but as shown in FIG. 2, by setting the time during which the pulse valve 20 is open (pulse width) to about 110 μs, the peak concentration of the nitrogen can be raised to about $1\times10^{19}$ atoms·cm$^{-3}$. Moreover, it is also easy to regulate the nitrogen concentration of the undoped layers to about $1\times10^{16}$ atoms·cm$^{-3}$ if nitrogen gas, as the carrier gas, is allowed to flow. Letting the carrier gas flow to supply the undoped layers with a certain amount of nitrogen flow is advantageous because this stabilizes the nitrogen concentration of the undoped layers so that it can be controlled to a constant concentration.

Figure 5A:
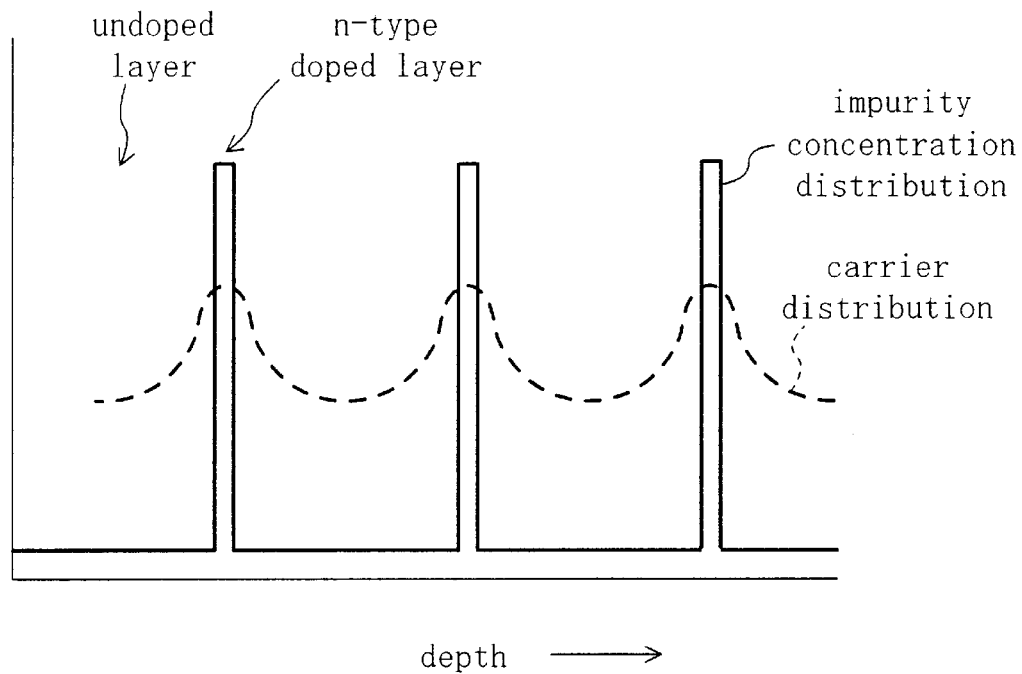
FIG. 5(a) is a diagram which schematically shows the relationship between the concentration profile of nitrogen and the carrier distribution in the depth direction of the active region according to the first embodiment.
Figure 5B:
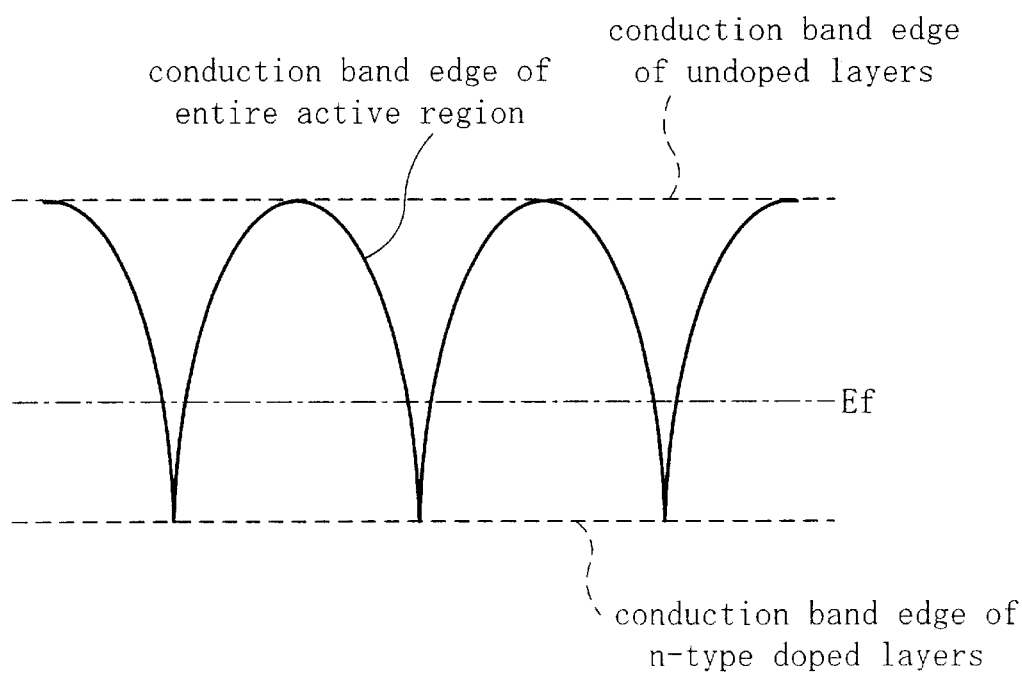
FIG. 5(b) is a partial band diagram showing the shape of the conduction band edge along the depth direction of that active region.

FIG. 5(a) is a diagram schematically showing the relationship between the concentration profile of nitrogen, which is an n-type impurity, and the carrier distribution in the depth direction of the active region 30, which has the basic structure of the present embodiment, and FIG. 5(b) is a partial band diagram showing the shape of the conduction band edge along the depth direction of the active region 30. However, FIGS. 5(a) and 5(b) are models created for the case that the nitrogen concentration in the undoped layers 22

(low-concentration doped layers) has been set to $5\times10^{15}$ atoms·cm$^{-3}$ without using nitrogen as the carrier gas, and the concentration of nitrogen in the n-type doped layers 23 (high-concentration doped layers) has been set to $1\times10^{18}$ atoms·cm$^{-3}$ by regulating the pulse width of the pulse valve to about 102 μs.

From the data shown in FIG. 4, the impurity concentration profile of the n-type doped layers 23 is given substantially by the shape of δ functions with respect to a primer of an undoped layer 22, as shown in FIG. 5(a). That is, the n-type doped layers 23 can be taken as so-called δ doped layers. In this case, the thickness of the n-type doped layers 23 is thin at about 10 nm, and thus quantum states due to quantum effects occur in the n-type doped layers 23, and the wave function of electrons localized in the n-type doped layers 23 expands to a certain degree. The result is a distribution in which carriers, as illustrated by the broken line in the diagram, are not only present in the n-type doped layers 23 but also in the undoped layers 22. Moreover, because electrons are continually supplied to the n-type doped layers 23 and the undoped layers 22 when the potential of the active region 30 is raised and the carriers are in motion, the electrons are always distributed so as to be not only in the n-type doped layers 23 but also in the undoped layers 22. In this state, electrons travel through the n-type doped layers 23 as well as the undoped layers 22, and thus the resistance value of the active region 30 is lowered. Because impurity ion scattering in the undoped layers 22 is reduced at this time, particularly high electron mobility can therefore be obtained in the undoped layers 22.

On the other hand, when the entire active region 30 has been depleted, the carriers can no longer exist in the undoped layers 22 and the n-type doped layers 23, and thus withstand voltage properties are regulated by the undoped layers 22, which have a low impurity concentration, and therefore a high withstand voltage value can be obtained throughout the entire active region 30.

Note that the above-mentioned effects can be obtained in the same way when holes, not electrons, are used as the carriers.

As shown in FIG. 5(b), the conduction band edge of the entire active region 30 is a shape connecting the conduction band edge of the n-type doped layers 23 and the conduction band edge of the undoped layers 22, which are both shown in the drawing as broken lines. Ordinarily, the impurity concentration of the n-type doped layers 23 is set to a concentration at which the conduction band edge of the n-type doped layers 23 is below the fermi level $E_f$, however, the impurity concentration of the n-type doped layers 23 does not necessarily have to be that concentrated.

Moreover, by using the active region 30 having this structure it is possible to obtain high-performance devices such as those shown in later embodiments. How the undoped layers 22 and the n-type doped layers 23 function as carrier transit regions in the active region 30 is explained in the below embodiments.

Note that in the present embodiment nitrogen was used to form the n-type doped layers, however, doping gas that includes other elements such as phosphorus (P) or arsenic (As) as the dopant showing n-type conductivity can be used in place of nitrogen without any problem.

Furthermore, n-type layers were formed in the present embodiment, however, it goes without mention that if a doping gas is used that includes p-type conductivity generating atoms such as boron (B), aluminum (Al), or gallium (Ga), then p-type doped layers having transition regions with an extremely sharp concentration distribution will be formed.

In the present embodiment, n-type doped layers (high-concentration doped layers) were formed on top of undoped layers, but it is also possible to use low-concentration n-type doped layers formed by opening the pulse valve instead of the undoped layers.

Furthermore, in the present embodiment a structure was described in which an active region was provided on a silicon carbide substrate (SiC substrate) by layering undoped layers (low-concentration doped layers) and n-type doped layers (high-concentration doped layers) using an epitaxial growth process, however, the structure of the active region according to the present invention can also be provided on a substrate made of a material other than silicon carbide (SiC). In particular, GaAs and GaN substrates, for example, have a band gap that is so wide that they are also called semi-insulator materials, and thus, applying them to the present invention has the benefit that a device with high-withstand voltage can be formed.

Still further, the present embodiment has been explained with a CVD process using induction heating as the method for growing a thin film on the substrate, but as long as gas is used to grow a thin film on the substrate, the thin film growth method of the present invention is of course also advantageous for growing a thin film on the substrate by plasma CVD, photo-induced CVD, or electron beam induced CVD.

Furthermore, the present invention can be suitably applied using methods other than CVD methods, such as sputtering, vapor deposition, or MBE to layer low-concentration doped layers (including undoped layers) and high-concentration doped layers, which are thinner than the low-concentration doped layers and are thin enough that carriers can migrate into the low-concentration doped layers due to quantum effects.

The following is a description of embodiments relating to various devices applying the active region 30 formed using the method of the present embodiment.

Second Embodiment

Figure 6:
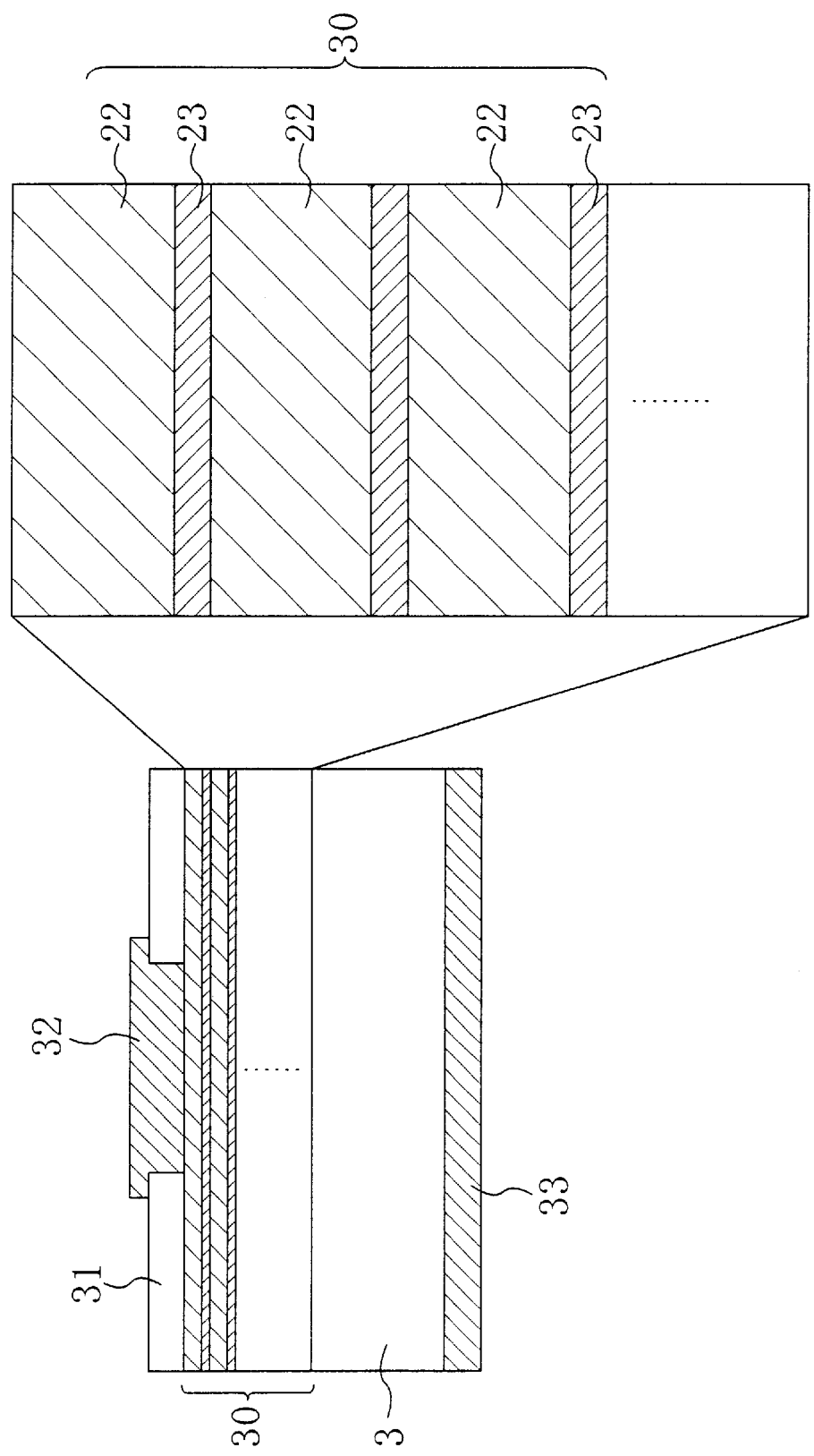
FIG. 6 is a cross-sectional view illustrating the schematic structure of a Schottky diode according to the second embodiment of the present invention.

First, a second embodiment relating to a Schottky diode using the active region having the structure of the first embodiment will be described. FIG. 6 is a cross-sectional view illustrating the schematic structure of a Schottky diode, which is a power semiconductor device, according to the second embodiment.

As shown in FIG. 6, provided on the principal face of the substrate 3, which is an n-type 6H—SiC substrate whose principal face is the (0001) off face, is an active region 30 in which undoped layers 22 (low-concentration doped layers) and n-type doped layers 23 (high-concentration doped layers) that have been formed with the method described above in the first embodiment are layered in alternation at 50 layers each. Here, the thickness of the substrate 3 is approximately 100 μm, and the nitrogen concentration within the substrate 3 is approximately $1\times10^{18}$ atoms·cm$^{-3}$. The thickness of the n-type doped layers 23 is approximately 10 nm, and the peak concentration of nitrogen in the n-type doped layers 23 is $1\times10^{18}$ atoms·cm$^{-3}$. The thickness of the undoped layers 22 is approximately 50 nm, and the nitrogen concentration in the undoped layers 22 is approximately $5\times10^{15}$ atoms·cm$^{-3}$. The thickness of the entire active region 30 is approximately 3000 nm (3 μm). The uppermost portion of the active region 30 is made of an undoped layer 22, and provided on top of the undoped layer 22 at the uppermost portion of the active region 30 are a guard ring 31 made of a silicon oxide film, and a Schottky electrode 32 made of a Ni alloy, which provides a Schottky contact with the undoped layer 22 at the uppermost portion of the active region 30 at an aperture portion that has been provided in the guard ring 31. An ohmic electrode 33 made of a Ni alloy is provided on the rear face of the substrate 3, and is in ohmic contact with the substrate 3. It is sufficient if the ohmic electrode 33 is in contact with the substrate 3 at some location, and it can also be in contact with a lateral face of the substrate 3.

The structure of the Schottky diode shown in FIG. 6 is formed by the following procedure. First, the substrate 3, which is a SiC substrate doped with:nitrogen to a high concentration, is placed inside the crystal growth apparatus shown in FIG. 1, CVD is performed as described in the first embodiment, and approximately 50 nm thick undoped layers 22 and approximately 10 nm thick n-type doped layers 23 are layered in alternation on the substrate 3 by epitaxial growth to form the active region 30. Next, a silicon oxide film is formed on the substrate, after which a portion of that film is opened up, thus forming the guard ring 31. Next, the ohmic electrode 33 made of a Ni alloy is formed on the rear face of the substrate 3, and the Schottky electrode 32 made of a Ni alloy is formed over the aperture region of the guard ring 31 on the substrate.

Figure 11:
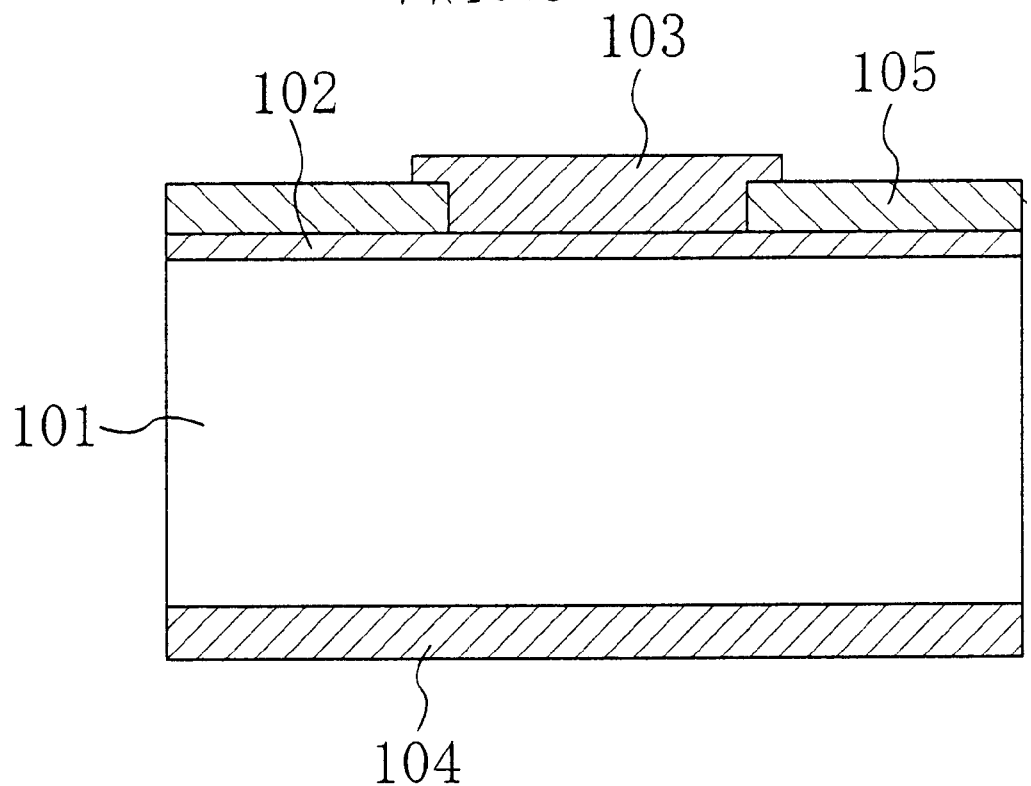
FIG. 11 is a cross-sectional view showing the schematic structure of a conventional Schottky diode in which silicon carbide (SiC) is used.

FIGS. 7(a1) to (c2) are energy band diagrams showing the change in shape of the conduction band edge due bias changes, for the Schottky diode of the present embodiment and the conventional Schottky diode shown in FIG. 11. Here, FIGS. 7(a1), (b1), and (c1) show the conduction band edge of the active region of the Schottky diode of the present embodiment, and FIGS. 7(a2), (b2), and (c2) show the conduction band edge of the n⁻ SiC layer of a conventional Schottky diode. Also, FIGS. 7(a1) and (a2) show the shape of the conduction band edge when no voltage is applied between the Schottky electrode and the ohmic electrode (0 bias), FIGS. 7(b1) and (b2) show the shape of the conduction band edge when a voltage is applied between the Schottky electrode and the ohmic electrode such that the Schottky electrode has a higher potential than the ohmic electrode (forward bias), and FIGS. 7(c1) and (c1) show the shape of the conduction band edge when a voltage is applied between the Schottky electrode and the ohmic electrode such that the ohmic electrode has a higher potential than the Schottky electrode (reverse bias). Note that the state of contact between the ohmic electrode 33 and the active region 30 does not substantially change with the change in bias, and therefore a diagrammatical description thereof has been omitted. Moreover, the present embodiment has been described with respect to a case wherein n-type semiconductor layers, in which electrons move as carriers, have been provided, and thus a diagrammatical description of the shape of the valence electron band edge has also been omitted.

As illustrated in FIGS. 7(a1) and (a2), in their natural state, both the Schottky diode of the present embodiment and the conventional Schottky. diode have a high Schottky barrier (of approximately 1 eV) between the uppermost portion of the active region and the Schottky electrode, or between the n⁻ SiC layer and the Schottky electrode, respectively.

Furthermore, as shown in FIG. 7(b1), when forward bias is applied to the Schottky diode of the present embodiment, the potential of the active region 30 rises, that is, the energy level of the conduction band edge of the entire active region 30 increases. Then, because a carrier distribution such as that shown in FIG. 5(a) occurs in the undoped layers 22 within the active region 30, current flows from the active region 30 to the Schottky electrode 32. That is to say, not only the n-type doped layers 23 in the active region 30 but also the undoped layers 22 function as carrier transit regions. At this time, although the carrier distribution in the undoped layers 22 is as shown in FIG. 5(a), there is a low concentration of impurities in those layers, so the impurity scattering in the undoped layers 22 is significantly reduced. Ordinarily, conductance of the semiconductor (the reciprocal of the resistance value) is proportional to the product of the electric field, carrier concentration, and carrier mobility, and carrier mobility increases in regions into which carriers have migrated. Consequently, with the Schottky diode of the present embodiment, the value of resistance of the entire active region 30 can be kept small, and low power consumption and large current can be achieved.

On the other hand, as shown in FIG. 7(b2), when forward bias is applied to the conventional Schottky diode, current flows from the n⁺ SiC substrate to the Schottky electrode, but at that time it must pass through the n⁻ SiC layer, which is a region of large electric resistance, and therefore a large amount of power must be used.

As illustrated in FIG. 7(c1), when a reverse bias is applied to the Schottky diode of the present embodiment, the entire energy level of the conduction band edge in the active region 30 becomes lower. Here, the value of the withstand voltage depends on the electric field applied to the depletion layer during reverse bias. With the Schottky diode of the present embodiment the thickness of the n-type doped layers 23 is extremely thin, and therefore the width of the depletion layer of the entire active region 30 can be thought of as being dependant on and determined by the impurity concentration of the undoped layers 22. In that case, the lower the impurity concentration, the smoother the slope of the conduction band edge becomes, so that naturally, the lower the impurity concentration, the wider the depletion layer width becomes. Therefore, a large withstand voltage value can be obtained in the Schottky diode of the present embodiment.

On the other hand, as illustrated in FIG. 7(c2), in the conventional Schottky diode, the width of the depletion layer of the n⁻ SiC layer changes in accordance with the impurity concentration of the n⁻ SiC layer, and therefore the resistance value and withstand voltage value can be controlled by adjusting the impurity concentration of the n⁻ SiC layer. However, there is the trade-off that the depletion layer width becomes narrow and the withstand voltage value drops when the impurity concentration of the n⁻ SiC layer is raised to reduce the value of resistance, but on the other hand, the value of resistance increases when the impurity concentration of the n⁻ SiC layer is reduced. This means that with a conventional Schottky diode it is difficult to simultaneously achieve low resistivity (low power consumption) and a high withstand voltage value, which are desirable in power devices.

In contrast, the Schottky device of the present embodiment takes advantage of the fact that in a forward bias state the carriers are distributed from the n-type doped layers 23 (high-concentration doped layers) into the undoped layers 22 (low-concentration doped layers), and a large current can flow easily without being subject to a large resistance. On the other hand, in a reverse bias state, there are no carriers in the undoped layers 22, and thus a high withstand voltage value is obtained. That is, attention was given to fact that the distribution of carriers is different in the forward bias and reverse bias states, and the trade-off between low resistivity and high withstand voltage that was given in conventional Schottky diodes can be eliminated.

For example, in the present embodiment, it was possible to achieve a Schottky diode having an actually measured high withstand voltage value of about 1000 V with respect to reverse bias. The on resistance of the Schottky diode of the present embodiment has an actually measured value of approximately $1\times10^{-3}$ $\Omega cm^2$, thus showing an extremely low resistance value.

Furthermore, it seems that the reason why the Schottky diode of the present embodiment has such a large withstand voltage value is not only because of the effects as those mentioned above, but also due to the effects explained below.

Figure 22:
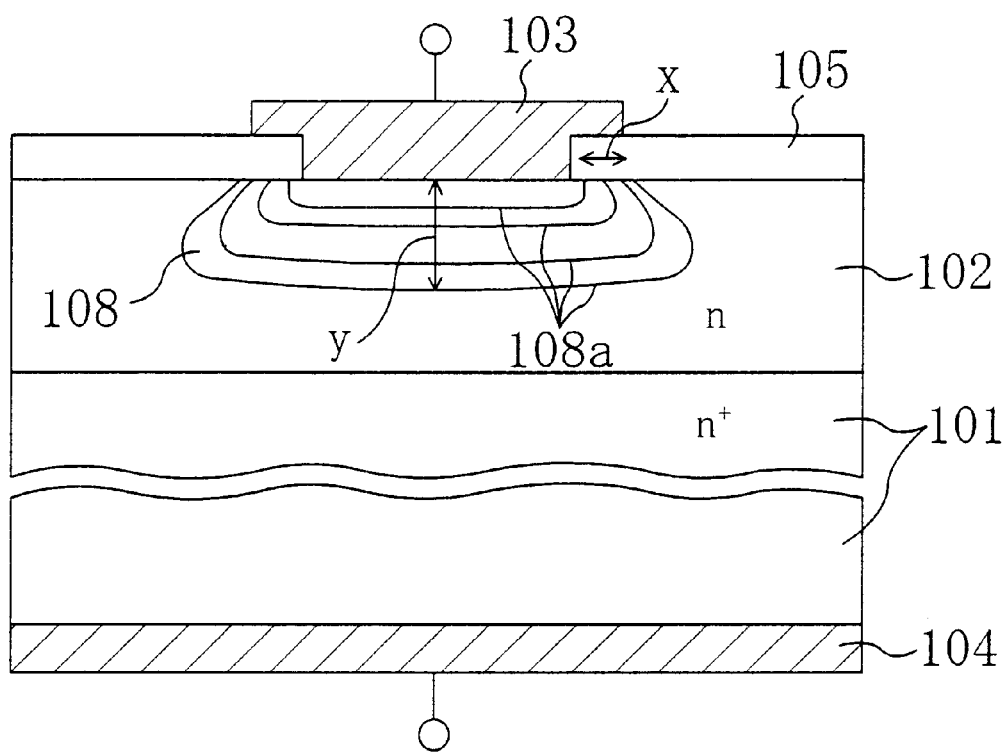
FIG. 22 is a cross-sectional view showing the widening of the depletion layer during reverse bias application in the conventional Schottky diode shown in FIG. 11, in which a SiC substrate is used.

FIG. 22 is a cross-sectional view showing the expansion of the depletion layer during reverse bias application in the conventional Schottky diode using a SiC substrate, shown in FIG. 11. As shown in FIG. 22, when a voltage (reverse bias) is applied between a Schottky electrode 103 and an ohmic electrode 104 such that the ohmic electrode 104 has a higher potential than the Schottky electrode 103, a depletion layer 108 spreads vertically and horizontally in the n⁻ SiC layer 102. At this time, the horizontal expansion of the depletion layer shown by the arrow x in the drawing is smaller than the vertical (thickness direction) expansion of the depletion layer shown by the arrow y in the drawing. That is, the horizontal spacing between equipotential planes 108a is narrower than the vertical spacing between equipotential planes 108a. The result is that the electric field within the depletion layer 108 becomes largest near the edge of the bottom face of the Schottky electrode 103, and insulation breakdowns at this portion occur easily.

Figure 23:
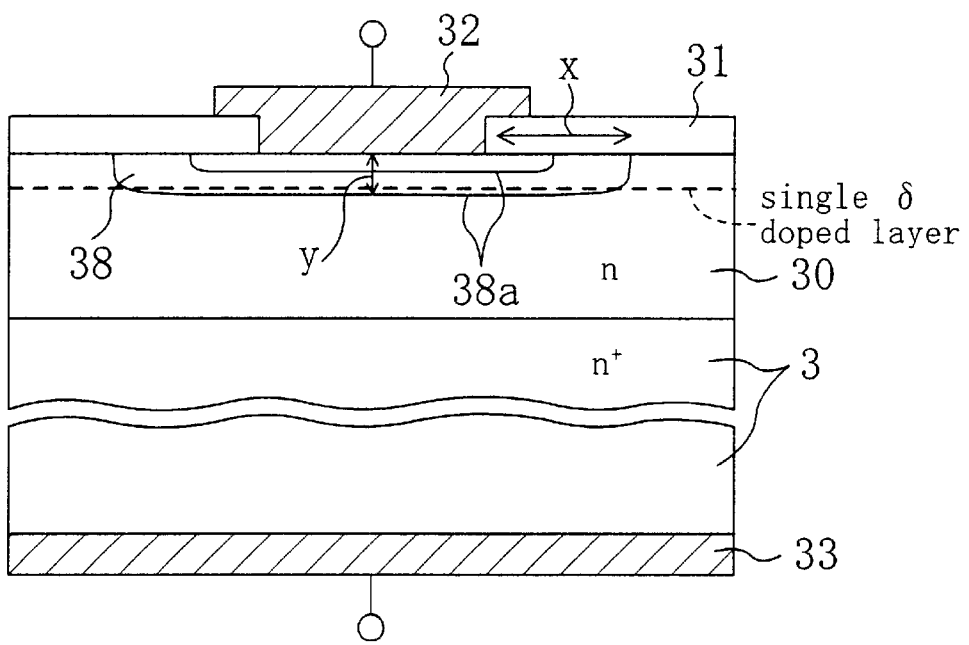
FIG. 23 is a cross-sectional diagram showing the expansion of the depletion layer during reverse bias application in a Schottky diode made by providing a single δ doped layer in the active region.

FIG. 23 is a cross-sectional view showing the expansion of the depletion layer during reverse bias application in a Schottky diode made by providing a single d doped layer in the active region. Here, only a single n-type doped layer (δ doped layer) is provided in the active region 30, and an undoped layer accounts for the rest of the active region. In this case, as shown in the drawing, when a voltage (reverse bias) is applied between the Schottky electrode 32 and the ohmic electrode 33 such that the potential of the ohmic electrode 33 becomes higher than that of the Schottky electrode 32, the depletion layer 38 spreads out vertically and horizontally within the active region 30. In this situation, the δ doped layer, which includes impurities at a high concentration, functions just like an electrode that has been inserted into a drift region (here the active region 30). Consequently, the depletion layer spreads outward vertically (thickness direction) as shown by the arrow y in the drawing, and when the depletion layer 38 comes into contact with the δ doped layer it is temporarily inhibited An by the δ doped layer from spreading further downwards, and therefore the horizontal expansion of the depletion layer, indicated by the arrow x in the drawing, becomes larger than the vertical expansion of the depletion layer. That is, the spacing between the equipotential planes 38a in the horizontal direction becomes wider than the spacing between the equipotential planes 38a in the vertical direction. The result is that the concentration of the electric field in the depletion layer 38 near the edge of the bottom face of the Schottky electrode 32 disappears almost completely. Moreover, the equipotential lines 38a in the depletion layer 38 are substantially parallel to the δ doped layer, and therefore vertical electric fields in the depletion layer 38 do not concentrate locally but rather occur uniformly throughout a wide area. Thus, breakdowns become less likely. Therefore, the Schottky diode according to the present invention has a higher withstand voltage value than the conventional Schottky diode shown in FIG. 22.

Figure 24:
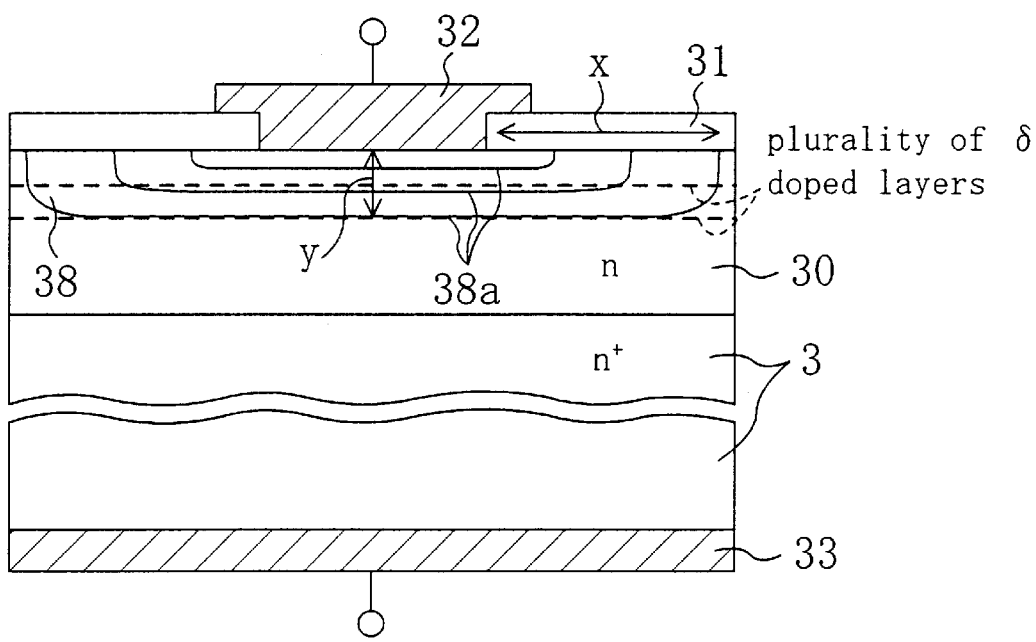
FIG. 24 is a cross-sectional view showing the expansion of the depletion layer during reverse bias application in a Schottky diode which has been made by providing a plurality of δ doped layers in the active region.

FIG. 24 is a cross-sectional view showing the expansion of the depletion layer during reverse bias application in a Schottky diode which has been made by providing a plurality of δ doped layers in the active region. Here, in the active region 30 only two n-type doped layers (δ doped layers) are provided, and an undoped layer accounts for all other areas in the active region. In this case, each time the depletion layer spreads vertically (in the thickness direction), as shown by the arrow y in the drawing, and comes into contact with the δ doped layers, further downward spread of the depletion layer 38 is temporarily prevented by the δ doped layers. Moreover, the equipotential lines 38a in the depletion layer 38 are more reliably formed parallel to the δ doped layers than in the structure shown in FIG. 23. Therefore, the concentration of an electric field in the depletion layer 38 is more reliably suppressed, and breakdowns occur less likely. Consequently, with the structure shown in FIG. 24 in which a plurality of δ doped layers are provided in the active region 30, it is possible to attain a higher withstand voltage value than with the structure shown in FIG. 23 in which only a single δ doped layer is provided in the active region 30. That is, generally speaking, the greater the number of δ doped layers in the active region 30 of the Schottky diode, the greater the withstand voltage value of the Schottky diode.

Note that in the present embodiment, the uppermost layer of the active region 30 was set to an undoped layer 22 of 50 nm thickness, however, the present invention is not limited to this particular embodiment. For example, the uppermost layer of the active region can be set to an undoped layer that is approximately 50 to 200 nm thick, and the thickness of this uppermost layer can be suitably adjusted by giving priority to either withstand voltage properties or the amount of electric current.

Third Embodiment

Figure 8:
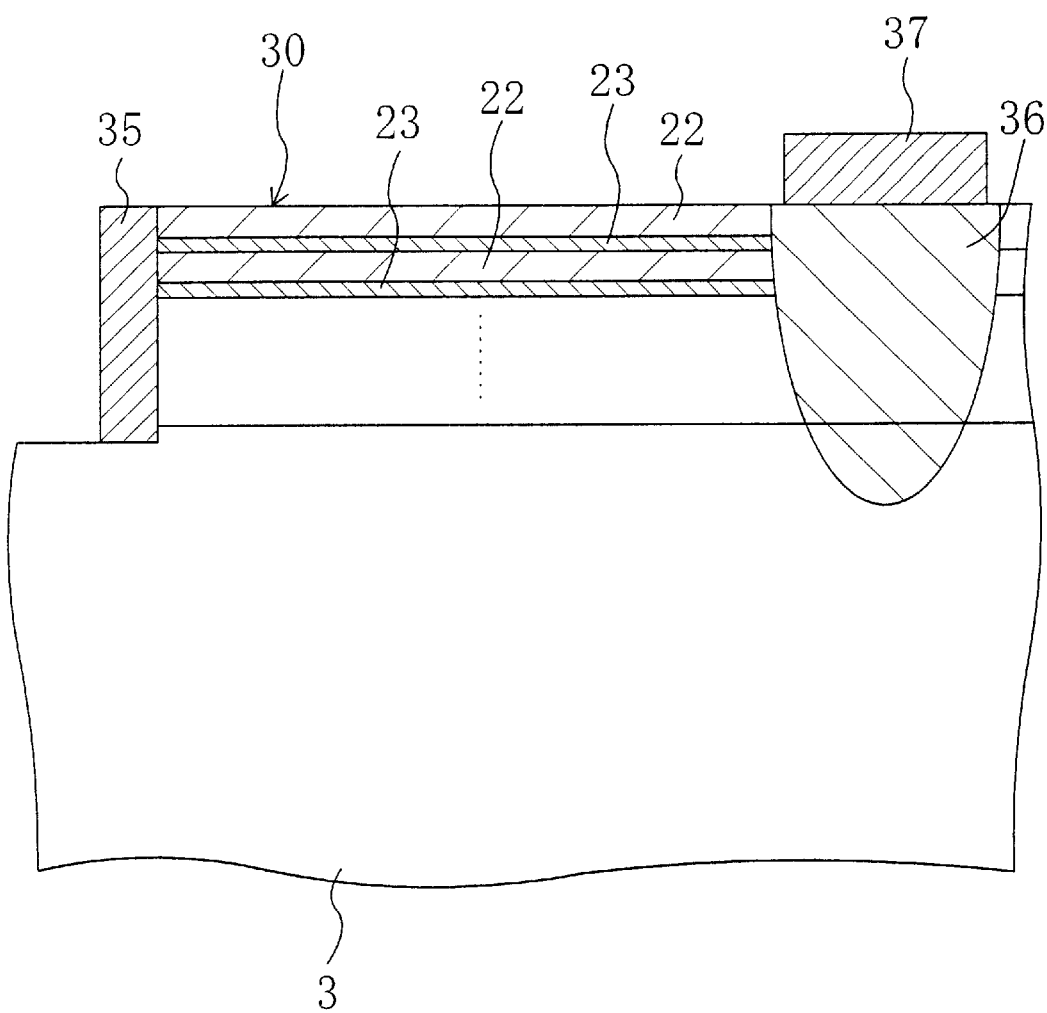
FIG. 8 is a cross-sectional view showing the schematic structure of a Schottky diode according to a third embodiment of the present invention.

The following is an explanation of a third embodiment of the present invention, which relates to a separate example of a Schottky diode having a structure that is fundamentally different from that of the second embodiment. FIG. 8 is a cross-sectional view showing the schematic structure of a Schottky diode, which is a power semiconductor device, according to the third embodiment.

As shown in the FIG. 8, provided on top of the principal face of the substrate 3, which is an n-type 6H—SiC substrate in which the principal face is the (0001) off face, is an active region 30 wherein undoped layers 22 (low-concentration doped layers) and n-type doped layers 23 (high-concentration doped layers), which are formed using a method that is basically the same as that described in the first embodiment, have been layered in alternation at fifty layers each. The substrate 3 is approximately 100 μm thick, and the substrate 3 is substantially semi-insulating because it has not been doped with impurities. The thickness of the n-type doped layers 23 is approximately 2 nm, and the peak concentration of nitrogen in the n-type doped layers 23 is $1\times10^{18}$ atoms·cm⁻³. The thickness of the undoped layers 22 is approximately 50 nm, and the concentration of nitrogen in the undoped layers 22 is approximately $5\times10^{15}$ atoms·cm⁻³.

In the present embodiment, the Schottky electrode 35 is provided not on but to the side of the active region 30. A trench is formed by hollowing out the active region 30 all the way to the substrate 3, and the Schottky electrode 35, which is made of a Ni alloy and which provides a Schottky contact with the active region 30, is arranged on the lateral face of this trench. That is, the Schottky electrode 35 is provided in Schottky contact with the first side faces of the undoped layers 22 and the n-type doped layers 23 in the active region 30. A doped layer 36 for connecting lead is formed such that it is in opposition to the Schottky electrode 35 and sandwiches the active region 30 therewith. That is to say, the doped layer 36 for connecting lead is formed by introducing a high concentration of impurities into a region of the active region 30 that is separated from the first faces of the undoped layers 22 and the n-type doped layers 23 by a certain spacing. The doped layer 36 for connecting lead is formed by implanting nitrogen ions into a portion of the active region 30 and the substrate 3, so he concentration of nitrogen in the doped layer 36 for connecting lead is approximately $1\times10^{18}$ atoms·cm$^{-3}$. Then, an ohmic electrode 37, which is made of a Ni alloy, is provided on the doped layer 36 for connecting lead and is in ohmic contact therewith. The interval between the Schottky electrode 35 and the doped layer 36 for connecting lead is approximately 10 μm. That is, the ohmic electrode 37 is provided connecting to the second side faces of the undoped layers 22 and the n-type doped layers 23 of the active region 30 via the doped layer 36 for connecting lead.

It should be noted here that the n-type doped layers 23 in the active region 30 and the Schottky electrode 35 are substantially not in ohmic contact for reasons explained later.

Moreover, it is not absolutely necessary that the doped layer 36 for connecting lead is provided. For example, an ohmic electrode that is in direct ohmic contact with the active region can be provided by forming a trench in the active region 30, filling in that trench with electrode material (Ni, for example), and performing a process to bring the active region 30 and the electrode material into ohmic contact.

The structure of the Schottky diode shown in FIG. 8 is formed using the following procedure. First, the substrate 3, which is a semi-insulating SiC substrate, is placed in the crystal growth apparatus shown in FIG. 1, CVD is performed as described in the first embodiment, and the undoped layers 22 of approximately 50 nm thickness and the n-type doped layers 23 of an approximately 2 nm thickness are grown epitaxially in alternation on the substrate 3 to form the active region 30. Next, nitrogen ions are injected into a portion of the active region 30 and the substrate 3 to form the doped layer 36 for connecting lead. Then, a portion of the active region 30 is removed by dry etching to form a trench. Then, the ohmic electrode 37, which is made of a Ni alloy, is formed on the doped layer 36 for connecting lead. Next, the Schottky electrode 35, which is made of a Ni alloy, is formed at the sidewall of the trench.

FIGS. 9(a1) to (c3) are energy band graphs showing the change in shape of the conduction band edge due to a change in bias, for the Schottky diode according to the present embodiment and a conventional Schottky diode. FIGS. 9(a1), (b1), and (c1) show the conduction band edge of the undoped layers 22 of the Schottky diode according to the present embodiment, FIGS. 9(a2), (b2), and (c2) show the conduction band edge of the n-type doped layers 23 of the Schottky diode according to the present embodiment, and FIGS. 9(a3), (b3), and (c3) show the conduction band edge of the SiC substrate of a conventional Schottky diode. In the conventional Schottky diode, however, a Schottky electrode spanning the n⁻ SiC layer and the n⁺ SiC layer in FIG. 11 cannot be provided and it would be completely meaningless to do so, and therefore in the conventional Schottky diode, a uniformly doped layer that has been doped with nitrogen to a uniform concentration and the Schottky electrode have been put in contact, and the ohmic electrode has been put into ohmic contact with a certain area of the uniformly doped layer. Moreover, FIGS. 9(a1) to (a3) show the shape of the conduction band edge when no voltage is applied between the Schottky electrode and the ohmic electrode (0 bias), FIGS. 9(b1) to (b3) show the shape of the conduction band edge when a voltage is applied between the Schottky electrode and the ohmic electrode such that the Schottky electrode has a higher potential than the ohmic electrode (forward bias), and FIGS. 9(c1) to (c3) show the shape of the conduction band edge when a voltage is applied between the Schottky electrode and the ohmic electrode such that the ohmic electrode has a higher potential than the Schottky electrode (reverse bias). The state of contact between the ohmic electrode 33 and the active region 30 does not substantially change with the change in bias, and therefore a diagrammatical description thereof has been omitted. Moreover, the present embodiment has been described with respect to a case wherein n-type semiconductor layers, in which electrons move as carriers, have been provided, and thus a diagrammatical description of the shape of the valence electron band edge has also been omitted.

As shown in FIGS. 9(a1) through (a3), in their natural states, both the Schottky diode of the present embodiment and the conventional Schottky diode have high Schottky barriers (approximately 1 to 2 eV) formed between the undoped layers or n-type doped layers of the active region and the Schottky electrode, and between the uniformly doped layer and the Schottky electrode, respectively.

As shown in FIGS. 9(b1) and (b2), when a forward bias is applied to the Schottky diode of the present embodiment, the potential of the active region 30 becomes higher, that is, the energy level of the conduction band edge in the undoped layers 22 and the n-type doped layers 23 of the active region 30 increases. In this situation, a carrier distribution such as that shown in FIG. 5(a) occurs also in the undoped layers 22, and thus current passes through both the n-type doped regions 23 and the undoped regions 22 of the active region 30 and flows easily into the Schottky electrode 35. That is to say, not only the n-type doped layers 23 in the active region 30 but also the undoped layers 22 function as carrier transit regions. At this time, although the distribution of carriers in the undoped layers 22 is as shown in FIG. 5(a), the concentration of impurities in those layers is low, and thus the scattering of impurities in the undoped layers 22 is lowered. Consequently, the value of resistance of the entire active region 30 can be kept small, and it is possible to achieve low power consumption and a large current.

On the other hand, as shown in FIG. 9(b3), when a forward bias is applied to the conventional Schottky diode, current flows from the uniformly doped layer into the Schottky electrode.

As shown in FIGS. 9(c1) and 9(c2), when a reverse bias is applied to the Schottky diode of the present embodiment, the entire energy level of the conduction band edge in the undoped layers 22 and the n-type doped layers 23 of the active region 30 becomes lower. As mentioned above, the value of the withstand voltage depends on the electric field that is applied to the depletion layer during reverse bias. Then, the lower the concentration of impurities, the smoother the slope of the conduction band edge becomes, so that naturally, the lower the concentration of impurities, the wider the depletion layer width becomes. A large withstand voltage value can therefore be obtained in the undoped layers 22, as illustrated in FIG. 9(c). On the other hand, in a case in which the high-concentration doped layers and the Schottky electrode are simply in contact with one another, the conduction band edge of the high-concentration doped layers during a reverse bias becomes that shown by the broken line in FIG. 9(c2), and the width of the depletion layer of the high-concentration doped layers should become extremely narrow. In the present embodiment, however, the thickness of the n-type doped layers 23 is extremely thin at 2 nm, so as shown by the solid line in FIG. 9(c2), from the fact that the depletion layer spreads out from the undoped layers 22 and expands to the n-type doped layers 23, the movement of electrons cannot occur.

Moreover, the distribution of carriers does not occur in the undoped layers 22 when the entire active region 30 has become depleted, and therefore to have current to flow from the Schottky electrode 35 to the doped layer 36 for connecting lead it must flow through only the n-type doped layers 23. However, because the thickness of the n-type doped layers 23 is extremely thin at 2 nm, the current encounters a significant resistance in the n-type doped layers 23, so that current does not actually flow. This means that there is substantially no ohmic contact between the n-type doped layers 23 and the Schottky electrode 35, and that Schottky contact is maintained therebetween. Additionally, by adjusting the thickness and impurity concentration, for example, of the undoped layers 22 and the n-type doped layers 23, the withstand voltage value can be regulated by the width of the depletion layer between the thick undoped layers 22 and the Schottky electrode 35. Consequently, a high withstand voltage value can be achieved.

On the other hand, as shown in FIG. 9(c3), in a conventional Schottky diode, the width of the depletion layer of the uniformly doped layer changes according to the impurity concentration of the uniformly doped layer, and therefore the resistance value and withstand voltage value can be controlled by adjusting the impurity concentration of the uniformly doped layer. As explained in the second embodiment, however, there is a trade-off in that the width of the depletion layer becomes narrow and the withstand voltage value drops when the impurity concentration of the uniformly doped layer is increased to lower the resistance value, while on the other hand the resistance value increases when the impurity concentration of the uniformly doped layer is reduced. Therefore, with the conventional Schottky diode shown in FIG. 11 it is difficult to simultaneously achieve the low resistivity (low power consumption) and high withstand voltage properties that are desirable in a power device.

In contrast, in the Schottky device of the present embodiment, in a forward bias state, the carriers are distributed from the n-type doped layers 23 (high-concentration doped layers) into the undoped layers 22 (low-concentration doped layers), and furthermore the scattering of impurities in the undoped layers 22 is reduced, and thus carriers (electrons) can be easily move from the doped layer 36 for connecting lead to the Schottky electrode 35. On the other hand, in a reverse bias state, the carriers do not exist in the undoped layers 22, and thus it is difficult for electrons to flow from the Schottky electrode 35 to the doped layer 36 for connecting lead passing only through the extremely thin n-type doped layers 23. That is, in the present embodiment, in the same way as in the second embodiment, attention was given to the fact that the distribution of carriers differs between the forward bias and reverse bias states, and it was possible to eliminate the trade-off between low resistivity and high withstand voltage that exists in conventional Schottky diodes.

Fourth Embodiment

Figure 10:
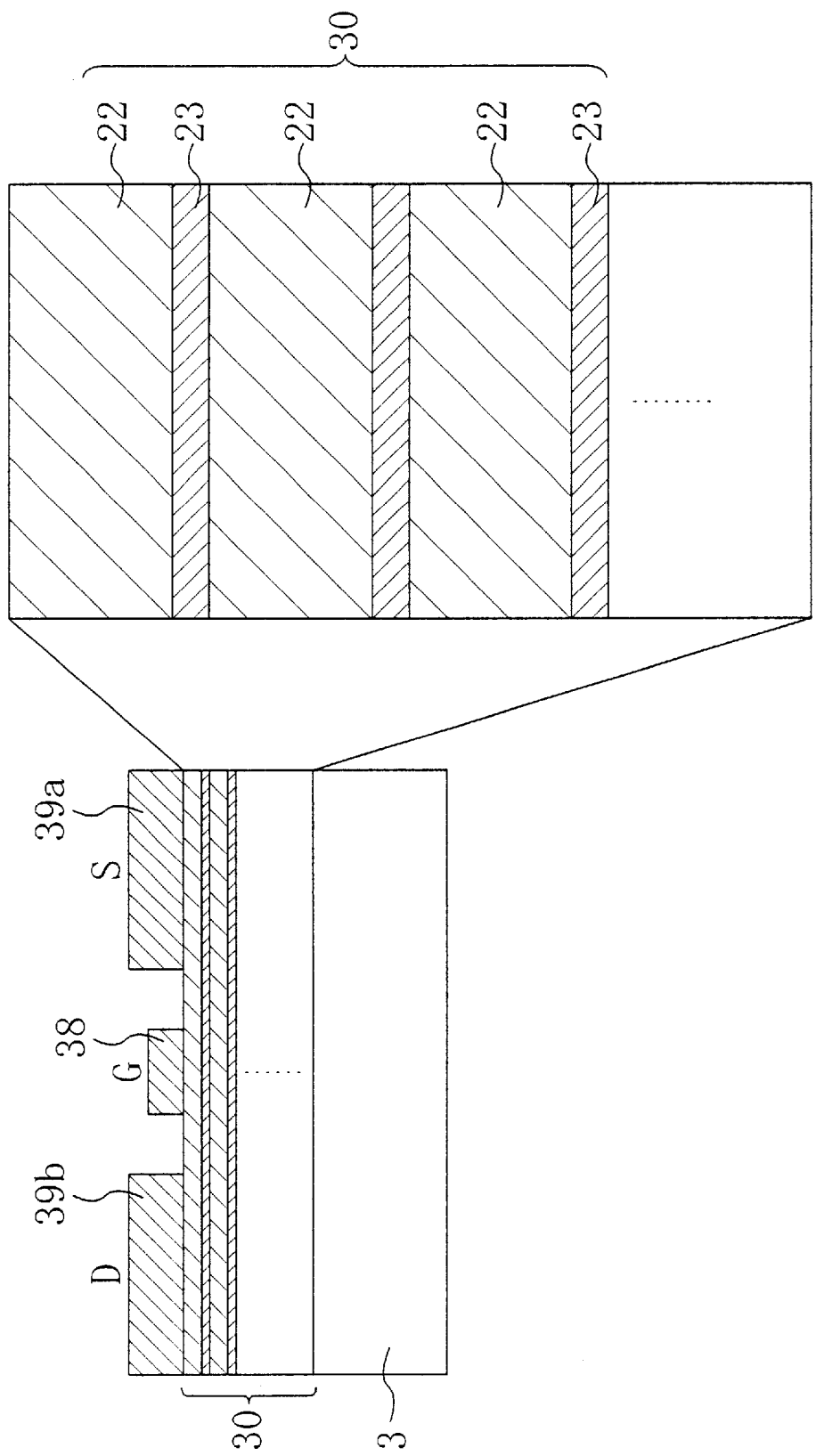
FIG. 10 is a cross-sectional view that shows the schematic structure of a MESFET according to the fourth embodiment of the present invention.

Next follows the description of a fourth embodiment relating to a MESFET that uses the active region 30 described in the first embodiment. FIG. 10 is a cross-sectional view that shows the schematic structure of the MESFET, which is a power semiconductor device, according to the fourth embodiment.

As shown in FIG. 10, provided on top of the principal face of the substrate 3, which is an n-type 6H—SiC substrate in which the (0001) off face is the principal face, is an active region 30 which functions as a channel layer, in which undoped layers 22 (low-concentration doped layers) and n-type doped layers 23 (high-concentration doped layers), which are formed using the method described in the first embodiment, have been layered in alternation at five layers each. The thickness of the substrate 3 is approximately 100 $\mu$m, and the substrates is substantially semi-insulating because it has not been doped with impurities. The thickness of the n-type doped layers 23 is approximately 10 nm, and the peak concentration of nitrogen in the n-type doped layers 23 is $1 \times 10_{18}$ atoms·cm$^{-3}$. The thickness of the undoped layers 22 is approximately 50 nm, and the concentration of nitrogen in the undoped layers 22 is approximately $5 \times 10^{15}$ atoms·cm$^{-3}$. In other words, the total thickness of the active region 30, which functions as the channel region of the MESFET, is approximately 300 nm.

In the present embodiment, further provided on the undoped layer 22 at the uppermost portion of the active region 30 is a gate electrode 38, which is a Schottky electrode made of a Ni alloy, which is in Schottky contact with that undoped layer 22, and a source electrode 39a and a drain electrode 39b, which are ohmic electrodes made of a Ni alloy and are in opposition to one another sandwiching the gate electrode 38 between them. The gate length of the gate electrode 38 is approximately 1 $\mu$m.

The structure of the MESFET shown in FIG. 10 is formed by the following procedure. First, the substrate 3, which is a semi-insulating SiC substrate, is placed inside the crystal growth apparatus shown in FIG. 1, CVD is performed as described in the first embodiment, and the undoped layers 22 and the n-type doped layers 23 are layered in alternation at-five layers each on the substrate 3 by epitaxial growth to form the active region 30. Next, the source electrode 39a and the drain electrode 39b, which are made of a Ni alloy, are formed on the substrate. In this situation, the source electrode 39a and the drain electrode 39b are in Schottky contact with the undoped layer 22 at the uppermost portion of the active region 30, however, the nature of that contact is later changed to ohmic contact with the undoped layer 22 at the uppermost portion of the active region 30 by subjecting the source electrode 39a and the drain electrode 39b to thermal processing for three minutes at 1000.C. Then, the gate electrode 38, which is made of a Ni alloy, is formed on the substrate, after which the above-mentioned thermal processing is not performed, and therefore the gate electrode 38 and the undoped layer 22 at the uppermost portion of the active region 30 are kept in a state of Schottky contact.

Here, a MESFET was created as a comparative example by providing a uniformly doped layer in which nitrogen was doped to a uniform concentration ($1 \times 10^{17}$ atoms·cm$^{-3}$) on a semi-insulating SiC substrate, and gate, source and drain electrodes, like those of the present embodiment, were provided on top of this uniformly doped layer to turn the uniformly doped layer into a channel layer.

In the present embodiment, when voltage is not applied to the gate electrode 38 but a positive voltage is applied to the drain electrode 39b, a potential difference similar to that with a reverse bias in the third embodiment is generated in the active region 30 between the region directly below the drain electrode 39b and the region directly below the gate electrode 38, but the width of the depletion layer is small. On the other hand, there is no potential difference between the region directly below the source electrode 39a and the region directly below the gate electrode 38. This results in carriers (electrons) being generated in the undoped layers 22 in the active region 30 as shown in FIG. 9(b1), and in the n-type doped layers 23 in the active region 30 as shown in FIG. 9(b2), and in the same way as in the third embodiment, the electrons travel within the active region 30 from the region directly below the source electrode 39a toward the region directly below the drain electrode 39b. At that time the electrons flow through both the undoped layers 22 and the n-type doped layers 23, and thus due to the same effects as the third embodiment, it is possible to obtain high electron mobility and low resistance.

Next, when a negative voltage is applied to the gate electrode 38, a large potential difference occurs in the same way as with a reverse bias in the third embodiment within the active region 30 between the region directly below the gate electrode 38 and the region directly below the drain electrode 39b. On the other hand, the same potential difference as that with a reverse bias in the third embodiment occurs in the region directly below the source electrode 39a and the region directly below the gate electrode 38. In other words, a depletion layer greatly spreads out in the active region 30 in the region directly below the gate electrode 38. Thus, due to the same effects as seen in the above-mentioned third embodiment, it becomes difficult for electrons to move only through the thin n-type doped layers 23, and therefore a high withstand voltage can be obtained between the source and drain.

The results of an evaluation of the performance of the MESFET according to the present embodiment, and a comparison of the performance of the MESFET of the present embodiment with those of a conventional MESFET, are explained below.

First, the MESFET of the present embodiment and a conventional MESFET were compared with regard to withstand voltage properties between the gate and the source. With the MESFET according to the present embodiment, in which the channel layer is the active region 30 formed by alternately layering undoped layers and n-type doped layers to five layers each, the withstand voltage is 120 V, which is four times the withstand voltage value of a conventional MESFET.

Next, the gate voltage dependency (I–V characteristics) of the relationship between drain current and drain voltage was evaluated in the MESFET of the present embodiment. By applying a steady voltage between the source electrode 39a and the drain electrode 39b and applying a voltage to the gate electrode 38, the current between the source and drain is modulated in accordance with the voltage that is applied to the gate electrode 38, and therefore a switching operation is attained. At this time, a stable drain current can be achieved without any breakdown even if the drain voltage is 140 V or higher.

Figure 12:
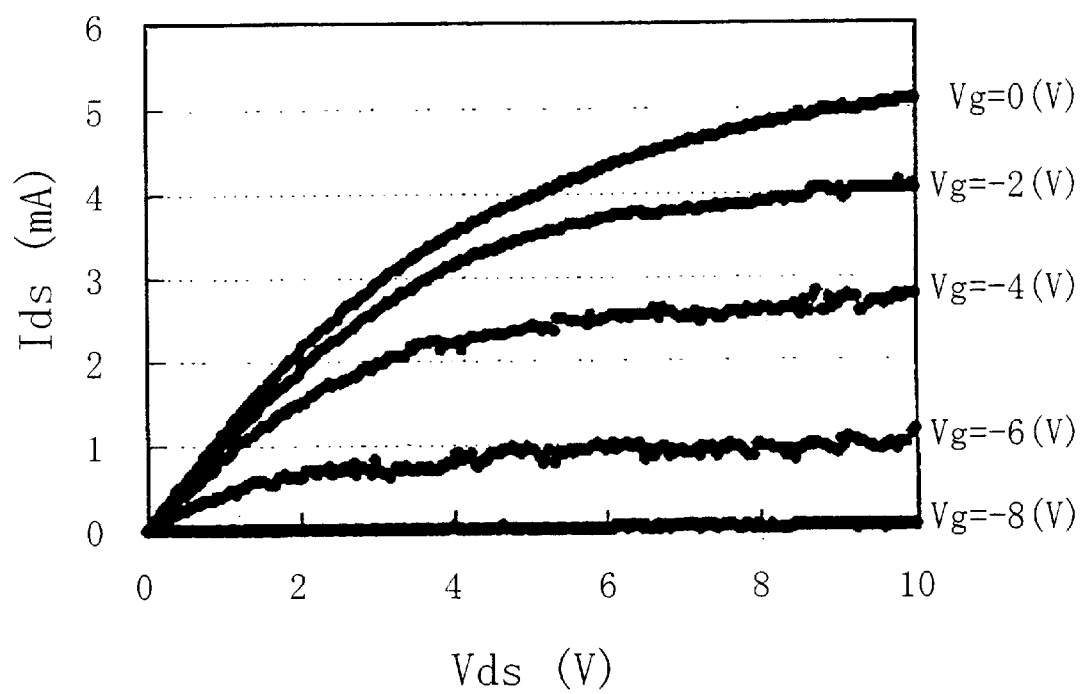
FIG. 12 is a diagram showing the measured results of the I–V characteristics of the MESFET according to the fourth embodiment.

FIG. 12 is a diagram showing the results of a measurement of the gate voltage dependency (I–V characteristics) of the relationship between drain current and drain voltage in the MESFET of the present embodiment. In FIG. 12, the horizontal axis represents the drain voltage $V_{ds}$ (V), and the vertical axis represents the drain current $I_{ds}$ (A), with the gate voltage $V_g$ as the parameter.

Furthermore, the mutual conductance near the threshold voltage was measured in the MESFET of the present embodiment and in the conventional MESFET. From those results it was found that trance conductance of the above-described MESFET of the present embodiment, in which the active region 30 serves as the channel layer, is approximately two times as high as that of a conventional MESFET in which a uniformly doped layer is used as the channel layer. This results from the above-mentioned increase in electron mobility in the MESFET of the present embodiment.

From the above results, the MESFET according to the present embodiment can achieve the effects of low power consumption, high withstand voltage, and high gain.

Other Embodiments

In the above-mentioned first through fourth embodiments, an active region 30 was provided in which many undoped layers 22 (low-concentration doped layers) and n-type doped layers 23 (high-concentration doped layers) were layered on top of each other, however, it is also possible to provide a structure in which only one layer each of a low-concentration doped layer and a high-concentration doped layer are provided in the active region.

In the above second through fourth embodiments, the n-type doped layers were formed as the high-concentration doped layers using nitrogen, but it is also possible to use a doping gas that includes other elements (for example, phosphorus (P) or arsenic (As)) as the dopant showing n-type conductivity in the low-concentration doped layers and/or the high-concentration doped layers.

Also, in the above second through fourth embodiments, n-type doped layers were formed as the high-concentration doped layers, but it goes without saying that that if a doping gas that includes atoms that generate p-type conductivity, for example boron (B), aluminum (Al), or gallium (Ga), is used to create the low-concentration doped layers and/or the high-concentration doped layers, then p-type doped layers having an extremely sharp concentration distribution in their transition regions will be formed.

Furthermore, in the above second through fourth embodiments, it is also possible to use, in place of a silicon carbide substrate (SiC substrate), a substrate made of a different material and to provide an active region thereon in which semiconductor layers (low-concentration doped layers and high-concentration doped layers) are grown epitaxially. In particular, substrates made of GaAs or GaN, for example, have in their intrinsic state large band gaps that are so wide that they have been labeled so-called semi-insulating materials, and are therefore advantageous in that by forming the active region 30 of the second through fourth embodiments onto such a substrate it is possible to obtain a device that has a high withstand voltage.

Still further, in the first through fourth embodiments, the undoped layers 22 (low-concentration doped layers=first semiconductor layers) and the n-type doped layers 23 (high-concentration doped layers=second semiconductor layers) in the active region 30 were formed by the same material SiC, but it is not absolutely necessary that the first semiconductor layers and the second semiconductor layers of the present invention are made of a common material. By forming the two layers from a common material, however, the slope of the potential barrier between the two layers becomes smooth, and thus it becomes easy for the carriers to be distributed throughout the entire active region.

In the present invention, it is not only possible to use CVD but also other methods such as sputtering, vapor deposition or MBE to layer the low-concentration doped layers (includes undoped layers) and the high-concentration doped layers (thickness varies with the material, but with a SiC substrate is about 20 nm or less) which are thinner than the low-concentration doped layers and are thin enough that the migration of carriers into the low-concentration doped layers due to quantum effects is possible. Moreover, the thickness of the low-concentration doped layers (includes undoped layers) can be as thick as about 100 nm, but should be thin enough that quantum effects occur.

At that time the value of the impurity concentration of the low-concentration doped layers and the high-concentration doped layers is not limited to the values disclosed in the above embodiments. That is to say, if the difference in impurity concentration between the high-concentration doped layers and the low-concentration doped layers is greater than a predetermined value (for example, about one order of magnitude), then the effects of the present invention can be achieved.

EXPERIMENTAL EXAMPLES

First Experimental Example

The following is a description of a first experimental example relating to the basic properties of an active region having δ doped layers, which was performed to confirm the effects of the present invention. In this first experimental example, broadly speaking, two types of substrates having an active region were created. The first of these is sample A, which has an active region that was made by layering a plurality of n-type δ doped layers (high-concentration doped layers) that are 10 nm thick and have a nitrogen concentration of $1 \times 10^{18}$ atoms·cm$^{-3}$, and a plurality of undoped layers (low-concentration doped layers) that are 50 nm thick. The other is sample B, which has an active region that was made by layering a plurality of δ doped layers with a thickness of 20 nm, and a plurality of undoped layers with a thickness of 100 nm. Next, a Schottky electrode was provided on these active regions to form a Schottky diode having the structure shown in FIG. 6. Thus the ratio of the thickness of the δ doped layers to the undoped layers both in sample A and sample B is 1:5, and therefore the average impurity concentration of samples A and B is the same. The data of the previously explained FIG. 4 are for the sample B, in which the thickness of the δ doped layers is 20 nm. Note that in the following description, the active region (channel region) made by layering the plurality of δ doped layers and the plurality of undoped layers is also referred to as the & doped channel layer.

Figure 13:
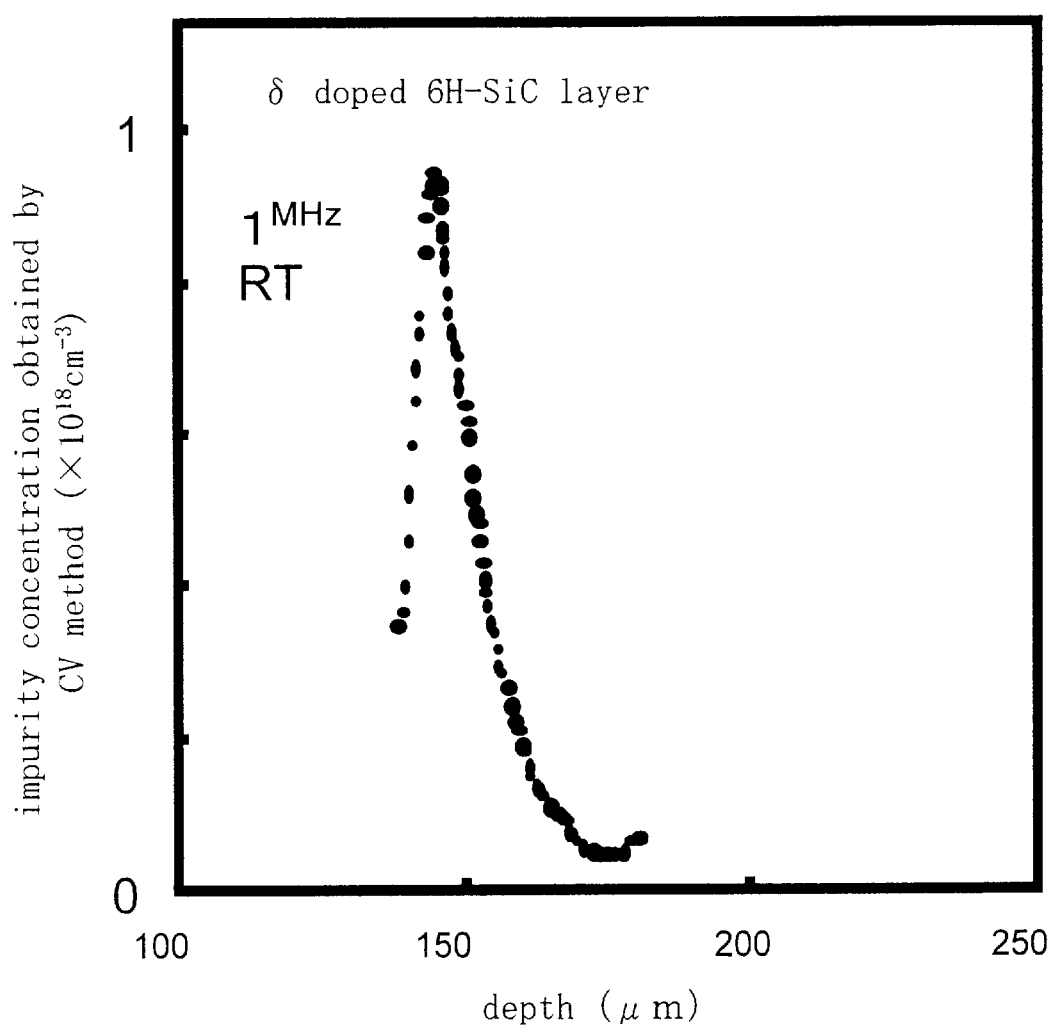
FIG. 13 is a diagram showing the results of a measurement with the C–V method of the impurity concentration of the Schottky diode according to a first experimental example.

FIG. 13 is a diagram showing the results of a measurement by the C–V method of the carrier concentration in the Schottky diode in order to precisely examine the profile of the δ doped layers in a case in which the nitrogen concentration is at $1 \times 10^{18}$ atoms·cm$^{-3}$. The measurement using the C–V method was performed by changing the bias between 0.5 V and –0.2 V and between 0.2 v and –2 V in a Schottky diode having a circular Ni Schottky electrode with a diameter of 300 μm, and applying a superimposed high frequency signal of 1 MHz with a very small amplitude. Then, the profile of the impurity concentration that is shown in the drawing is that of the δ doped layers removed from the active region in which 10 nm thick δ doped layers and 50 nm thick undoped layers were layered. As shown in the drawing, the concentration profile in the depth direction is substantially vertically symmetrical, and shows that due to the epitaxial growth method in the embodiments of the present invention, doping memory effects (residual effects of the dopant) during epitaxial growth with CVD can be ignored.

Moreover, the planar carrier concentration of the δ doped layers according to the C–V method is $1.5 \times 10^{12}$ cm$^{-2}$, which matches comparatively well with the planar concentration of approximately $2.5 \times 10^{12}$ cm$^{-2}$ that was obtained from the measurement of the Hall coefficient. Also, the full width at half maximum of this pulse-shaped profile is 12 nm, showing considerable sharpness.

Figure 14:
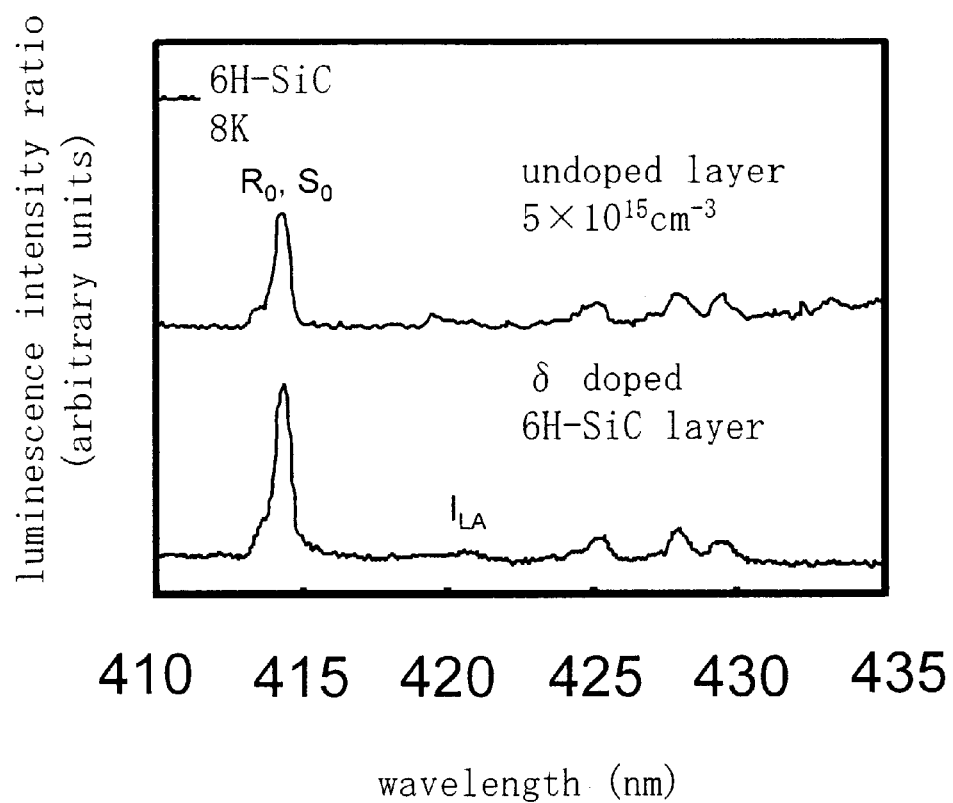
FIG. 14 is a diagram showing the results of a measurement of the band edge photoluminescence spectrum of the δ doped layers in the 6H—SiC substrate according to the first experimental example.

FIG. 14 is a diagram showing the results of a measurement of the band edge photoluminescence spectrum of the δ doped layers in the 6H—SiC substrate. This spectrum was obtained at a temperature below 8 K, and for the excitation source, a He—Cd laser of a 0.5 mW intensity was used. This diagram compares the spectrum obtained from an undoped layer of the active region in which 10 nm thick d doped layers and 50 nm thick undoped layers were layered, and the spectrum obtained from an undoped layer of a 1 μm thickness. As shown in the graph, both spectrum patterns have luminescence peaks in the same wavelength regions and at the same intensities, and thus it can be seen that both have the same impurity concentration. In other words, hardly any rise in the impurity concentration due to the scattering of impurities from the δ doped layers could be seen in the undoped layers of the layered structure made of δ doped layers and undoped layers, and it can be seen that these layers were layered while maintaining substantially the desired impurity concentration profile. Particular note should be given to the fact that the impurity concentration of the undoped layers was regulated to a low value of about $5 \times 10^{16}$ atoms·cm$^{-3}$. That is, in the data shown in FIG. 4 it was detected that the impurity concentration in the undoped layers was on the order of $10^{17}$ atoms·cm$^{-3}$, however, that discrepancy was caused by the limits of the measurement sensitivity using SIMS. Then, by using a photoluminescence method, it was confirmed that the impurity concentration of the undoped layers in the active region of the present invention, which was obtained by alternately layering δ doped layers and undoped layers, was of a low concentration of about $5 \times 10^{16}$ atoms·cm$^{-3}$.

Figure 15A:
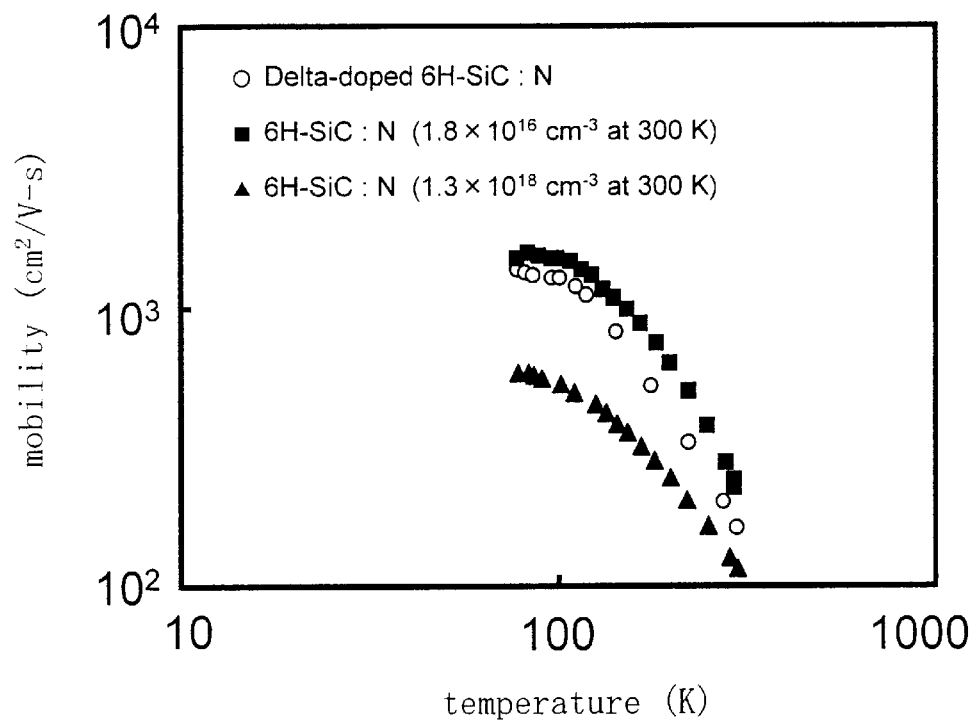
FIG. 15(a) is a graph illustrating the temperature dependency of the electron mobility in the 6H—SiC layer according to the first experimental example.
Figure 15B:
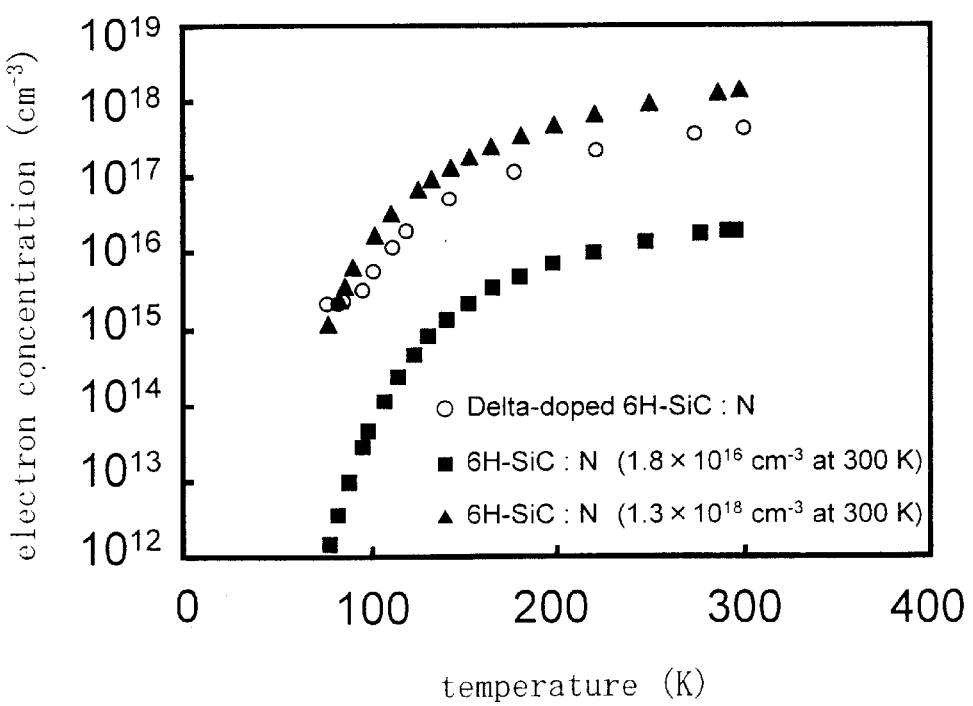
FIG. 15(b) is a graph illustrating the temperature dependency of the electron concentration in the same.

FIG. 15(a) shows the data illustrating the temperature dependency of the electron mobility in a 6H—SiC layer, and FIG. 15(b) shows the data illustrating the temperature dependency of the electron concentration in the same. In FIGS. 15(a) and 15(b), ○ marks represent the data from the 6H—SiC layer (sample A), which is made by layering δ doped layers (in which nitrogen is the dopant) of a thickness of 10 nm, and undoped layers of a thickness of 50 nm, ■ marks represent data from the low-concentration uniformly doped layers ($1.8 \times 10^{16}$ cm$^{-3}$) of the 6H—SiC, and ▲ marks represent data from the high-concentration uniformly doped layers ($1.3 \times 10^{18}$ cm$^{-3}$) of the 6H—SiC. As shown in FIGS. 15(a) and 15(b), in the low-concentration uniformly doped layers ($1.8 \times 10^{16}$ cm$^{-3}$) of the 6H—SiC, there is a low impurity concentration, and therefore the mobility of electrons in these layers is large because the scattering of carriers caused by impurities when the carriers are moving becomes smaller. On the other hand, in the high-concentration uniformly doped layers ($1.3 \times 10^{18}$ cm$^{-3}$) of the 6H—SiC, the impurity concentration is high, and therefore the mobility of electrons in these layers is small because the scattering of carriers caused by impurities when the carriers are moving becomes larger. That is to say, there is a tradeoff between carrier concentration and carrier movement characteristics. In contrast, it can be seen that in the δ d doped layers in the active region of the sample A, the electron concentration is substantially as high as that of the high-concentration uniformly doped layers, and the mobility of electrons is high. This means that the active region of the present invention has a high electron concentration and at the same time can attain a high electron mobility, and thus it can be seen that this structure is suitable as the region of diodes and transistors through which electrons move. When the carriers are holes, there is in principle no change from the case in which they are electrons, so it can be assumed that in p-type δ doped layers the hole concentration can be maintained high while a high hole mobility can be achieved.

FIG. 16 shows the data illustrating the temperature dependency of electron mobility in sample A, which has an active region made by layering δ doped layers with a thickness of 10 nm and undoped layers with a thickness of 50 nm, and sample B, which has an active region made by layering δ doped layers with a thickness of 20 nm and undoped layers with a thickness of 100 nm. These data on electron mobility were obtained by measuring the samples within a temperature range of 77 to 300 K. As mentioned above, both sample A and sample B share. the same ratio of thickness of d doped layers to undoped layers of 1:5, and despite the fact that both sample A and B were given the same average impurity concentration, it can be seen from the graph that the electron mobility in sample A is larger than the electron mobility in sample B. In particular, the graph shows that in low temperature regions, the electron mobility in sample B drops as the temperature becomes lower because of scattering due to ionized impurities, however, in sample A, a high electron mobility is-maintained even as the temperature becomes lower.

Figure 17A:
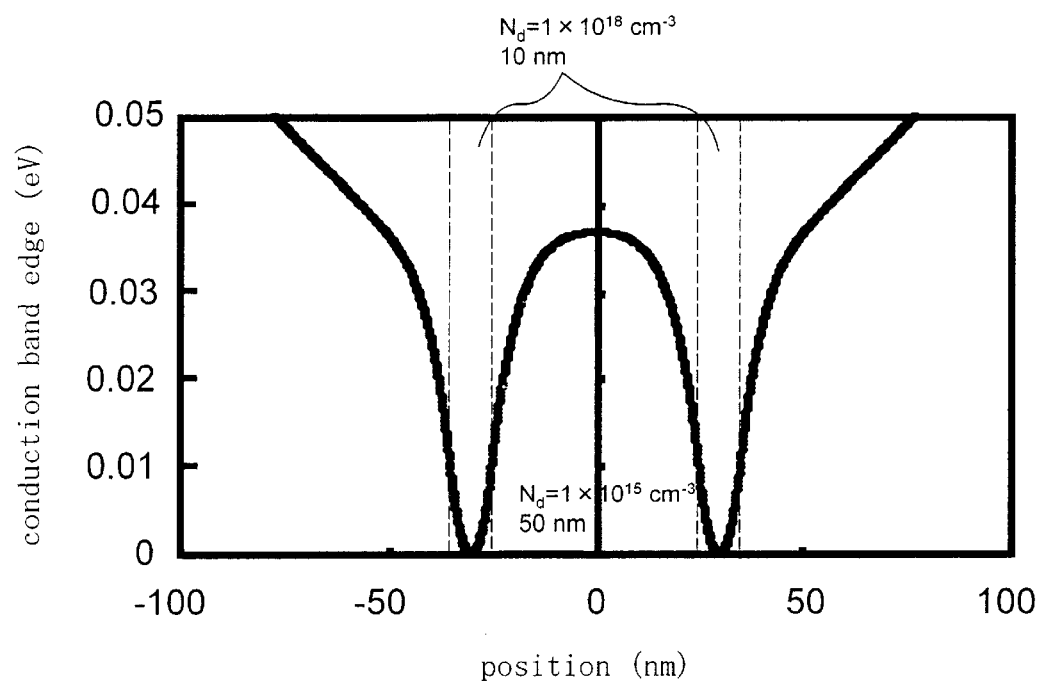
FIG. 17(a) is a diagram showing the results of a simulation of the band structure of the conduction band edge in sample A according to the first experimental example.
Figure 17B:
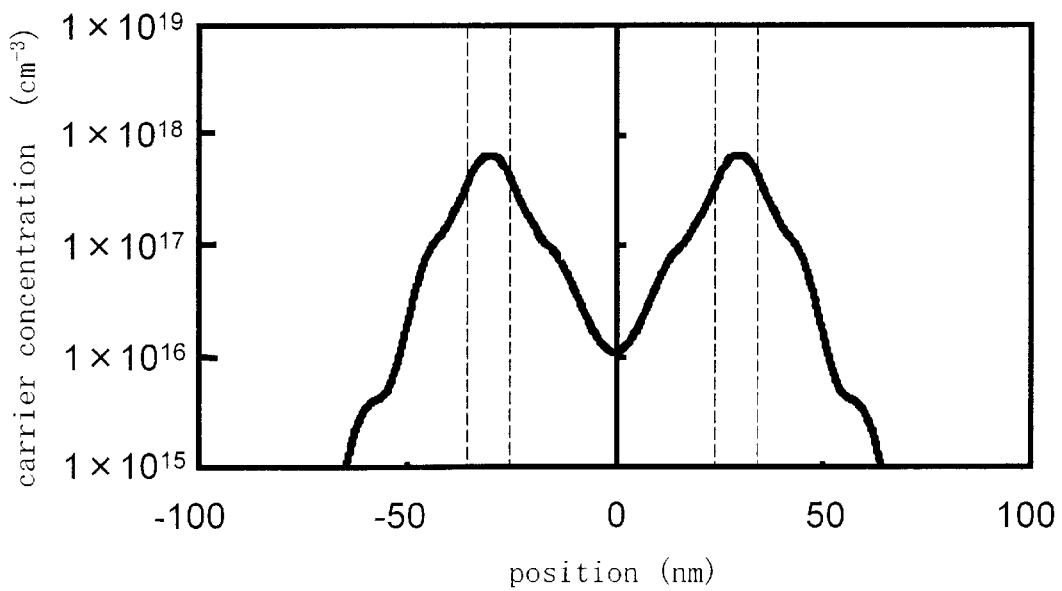
FIG. 17(b) is a diagram showing the results of a simulation of the carrier concentration distribution in the same.
Figure 18A:
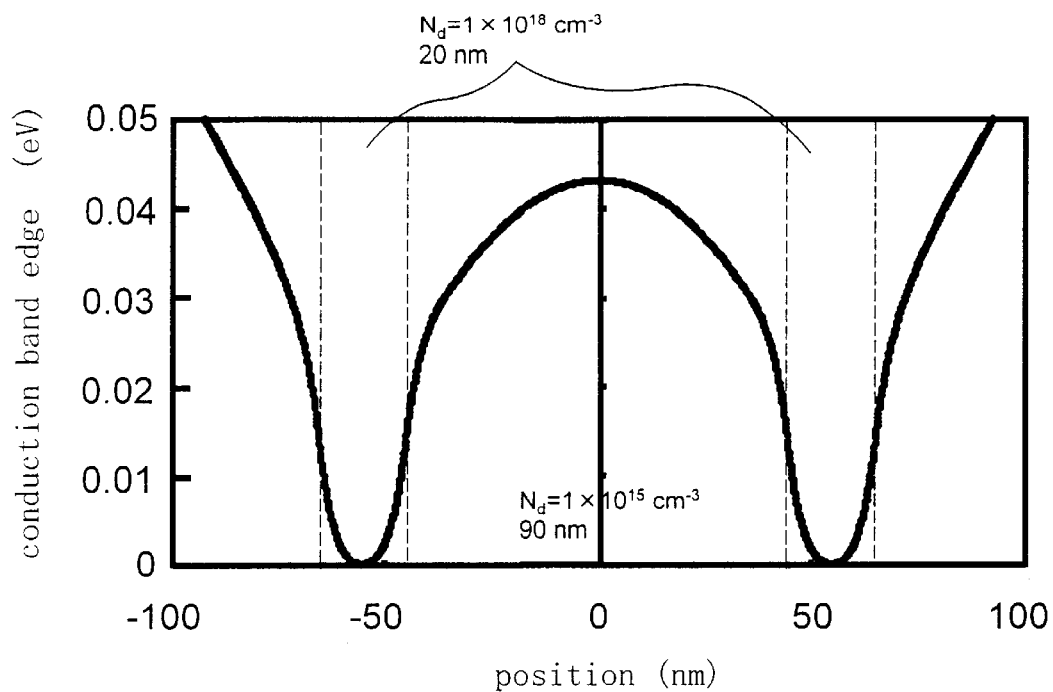
FIG. 18(a) is a diagram showing the results of a simulation of the band structure of the conduction band edge in sample B according to the first experimental example.
Figure 18B:
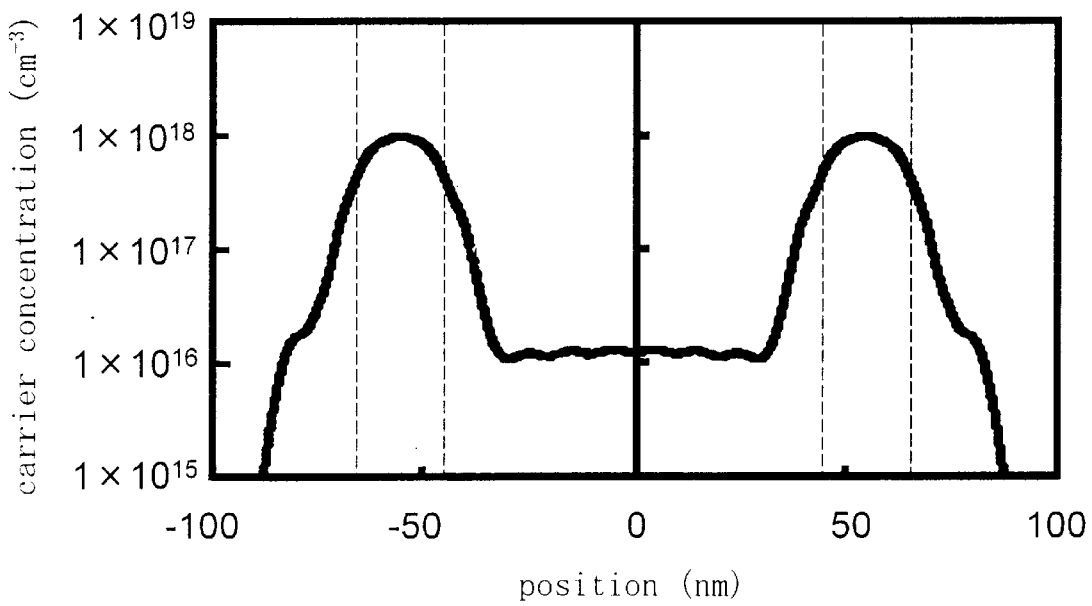
FIG. 18(b) is a diagram showing the results of a simulation of the carrier concentration distribution in the same.

FIG. 17($a$) is a diagram showing the results of a simulation of the band structure of the conduction band edge in sample A, which has 10 nm thick δ doped layers, and FIG. 17($b$) is a diagram showing the results of a simulation of the carrier concentration distribution in the same. FIG. 18($a$) is a diagram showing the results of a simulation of the band structure of the conduction band edge in sample B, which has 20 nm thick δ doped layers, and FIG. 18($b$) is a diagram showing the results of a simulation of the carrier concentration distribution in the same. As shown in FIG. 17($a$) and 18($a$), in a cross-section that is perpendicular to the δ doped layers, the electrons are confined in a V-type Coulomb potential (quantum well) that is sandwiched by positively charged donor layers, and in these wells quantum states are formed. The effective mass of the electrons is 1.1, and the dielectric constant of the 6H—SiC layer is 9.66. The background carrier concentration of the 6H—SiC layer, which is used for the undoped layers, is $5 \times 10^{15}$ cm$^{-3}$, and the carrier concentration of the n-type δ doped layers is $1 \times 10^{18}$ cm$^{-3}$.

As shown in FIG. 17($b$), in the 10 nm thick δ doped layers (sample A), the two-dimensional electrons are dispersed widely to the undoped layers sandwiched between two δ doped layers, and the region in which the electron concentration was $2 \times 10^{16}$ cm$^{-3}$ or more was at a range of 25 nm from the interface. That is, this carrier distribution matches the carrier distribution that is schematically sketched in FIG. 5($a$), and it can be seen that the carriers migrate from the δ doped layers to the undoped layers.

On the other hand, as shown in FIG. 18($b$), in the 20 nm thick δ doped layers (sample B), the regions in which there is a high rate of carriers that are regulated by the wave function of the electrons, and the δ doped layers which have ionization scattering centers, strongly overlap with-one another, and thus the region in which the electron concentration was $2 \times 10^{16}$ cm$^{-3}$ or more within a range of 11 nm from the interface. That is, it was found that there is a relatively small migration of carriers from the δ doped layers to the undoped layers.

Second Experimental Example

The following is a description of a second experimental example in which an active region such as that disclosed in the first experimental example, which has d doped layers that exhibit high electron mobility, is used as the channel region of a MESFET.

Figure 19:
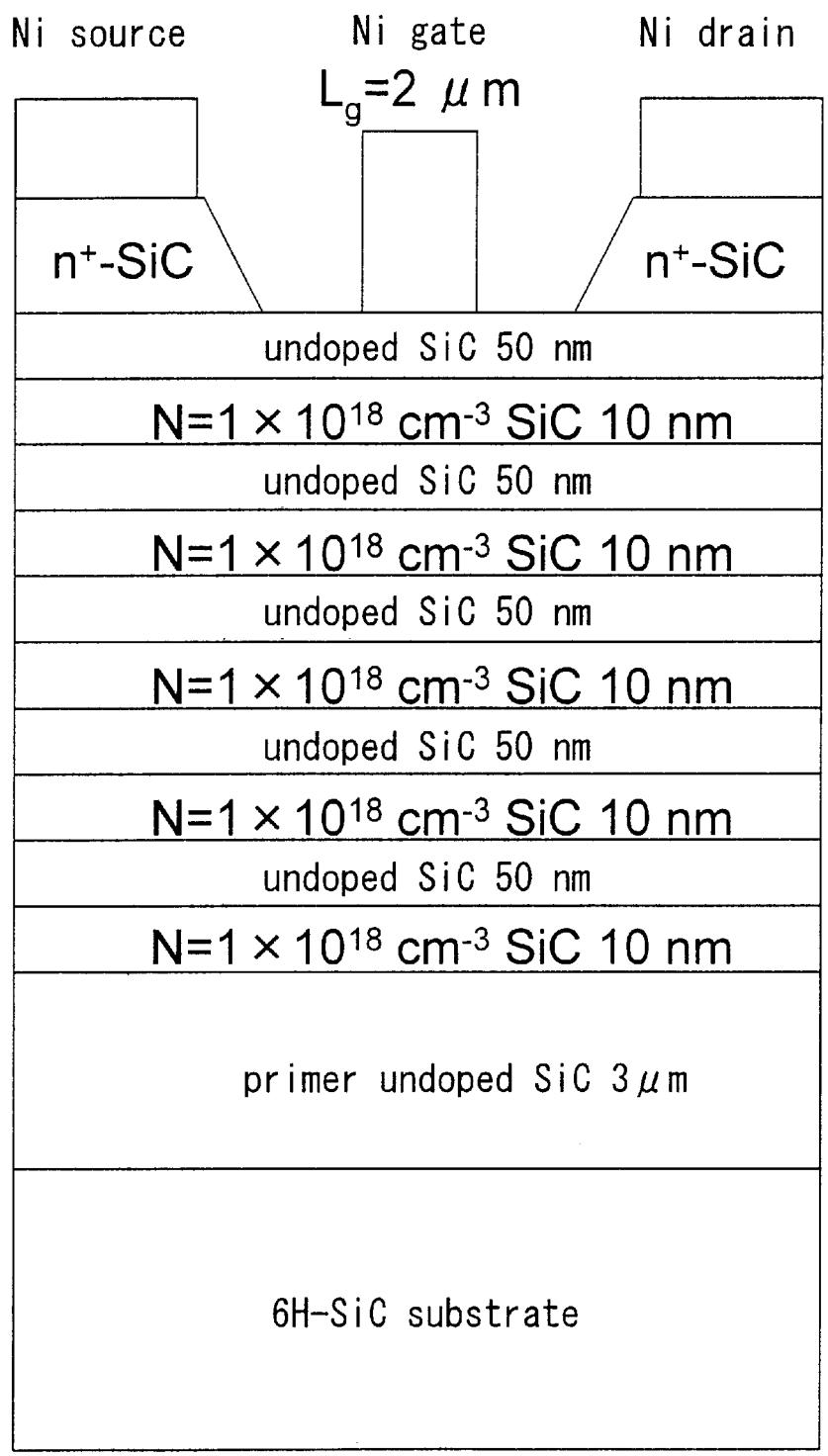
FIG. 19 is a cross-sectional view schematically showing the structure of the MESFET according to the second experimental example.

FIG. 19 is a cross-sectional view that schematically shows the structure of the MESFET according to this experimental example. As shown in FIG. 19, the MESFET used in this experimental example includes a 6H—SiC substrate (principal face is the (0001) face); a primer undoped SiC layer with a thickness of approximately 3 µm that was epitaxially grown on the 6H—SiC substrate; an active region made by alternately layering on the primer undoped layer five layers each of epitaxially grown 10 nm thick δ doped layers (with an impurity (nitrogen) concentration of approximately $1 \times 10^{18}$ atoms·cm$^{-3}$) and 50 nm thick undoped layers; a Ni gate electrode provided on the center portion of the active region; two n$^+$ SiC layers. (source and drain regions) provided on both ends of the active region such that they sandwich the Ni gate electrode; and a Ni source electrode and a Ni drain electrode provided on the n$^+$ SiC layers. The uppermost portion of the active region is an undoped layer, and this uppermost undoped layer is in Schottky contact with the Ni gate electrode. On the other hand, the n$^+$ SiC layer and the Ni source and Ni drain electrodes are in ohmic contact. The gate length of the Ni gate electrode is approximately 2 µm, the distance between the Ni source electrode and the Ni drain electrode is approximately 150 µm, and the gate width is approximately 5 µm.

Here, in the fabrication process of the MESFET, the state of ohmic contact between the n$^+$ SiC layer and the Ni source and Ni drain electrodes is formed by performing an anneal of 1000.C for five minutes after the Ni electrodes are formed. The value of resistance of the ohmic contact measured by TLM (transmission line method) is approximately $1 \times 10^{-5}$ Ωcm$^2$, for example. The structure of the recessed gate is made by patterning the n$^+$ SiC layer by plasma reactive ion etching (RIE) using CF$_4$ and O$_2$. At that time, the flow rate of CF$_4$ is 15 sccm (.0.015 l/min), the flow rate of O$_2$ is 15 sccm (·0.015 l/min), and the pressure is 50 mTorr (·6.67 Pa). By making the etch rate as small as, for example, about 15 nm/min at a high frequency input of about 80 W, damage to the surface portion of the SiC layer due to the ion bombardment can be reduced.

Figure 20:
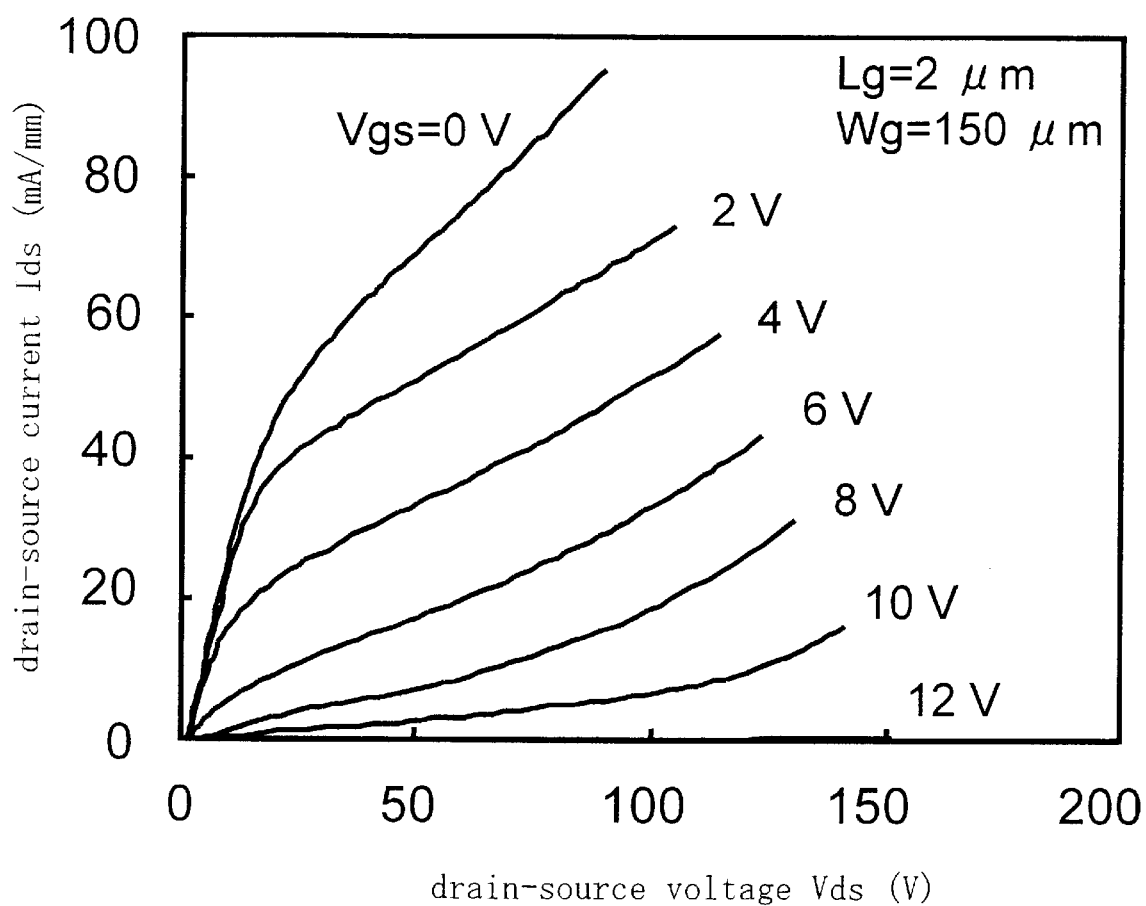
FIG. 20 is a diagram showing the I–V characteristics of the MESFET fabricated in the second experimental example.

FIG. 20 is a diagram showing the I–V characteristics of the MESFET that was produced in this experimental example. In FIG. 20, the horizontal axis expresses the voltage between drain and source, the vertical axis expresses the current between drain and source, and the gate-source voltage $V_{gs}$ is the parameter. When the gate-source voltage $V_{gs}$ is 0 V and the drain-source voltage is 100 V, the extrinsic mutual conductance is 15 mS/mm (S=1/Ω) and the drain current density is 96 mA/mm. When the gate length of a FET having a δ doped channel layer is 0.5 µm, the extrinsic mutual conductance is ideally 60 mS/mm. That is, it can be seen that the channel mobility of the FET having a δ doped channel according to this experimental example is larger than the channel mobility of an ordinary 6H—SiC-type MESFET. Moreover, because the power P of the MESFET is represented by the equation:

$$P = V_{dsmax} \cdot I_{dsmax}/8$$

it can be seen that the MESFET of this experimental example is suitable for a power device.

From FIG. 20 it can be seen that when the gate-source voltage is −12 V, the breakdown voltage between drain and source is at least 150 V or more. Although not shown in FIG. 20, the breakdown voltage between drain and source when the gate-source voltage is −12 V was approximately 200 V. That is, the so-called withstand voltage value of the MES-FET according to this experimental example is about 150 to 200 V.

Figure 21:
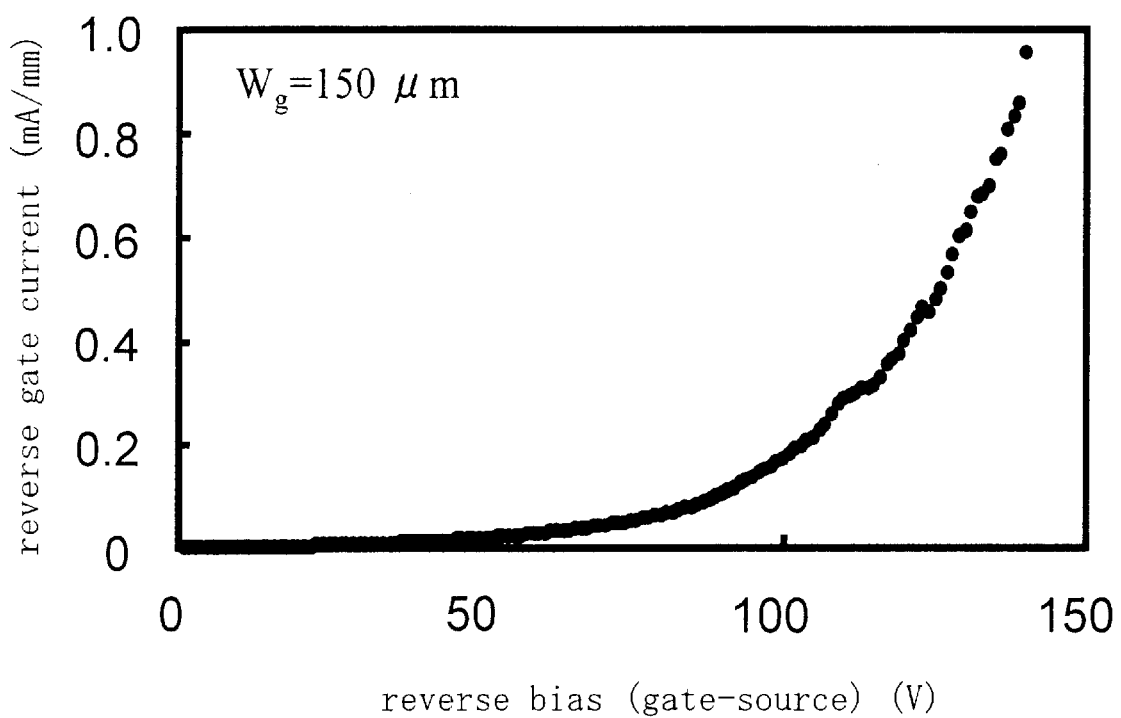
FIG. 21 is a graph showing the dependency of the reverse gate current on the reverse gate-source voltage in the MESFET of the second experimental example.

FIG. 21 is a graph showing the dependency of reverse gate current to reverse gate-source voltage in the MESFET of this experimental example. As shown in FIG. 21, the gate breakdown voltage, which is defined as the reverse voltage between the gate and source when the average reverse gate current is 1 mA/mm, is approximately 140 V. Moreover, the height of the Schottky barrier is 1.2 eV, and the n value is 1.1. The above results demonstrate that the MESFET having a δ doped channel layer according to this experimental example has a high breakdown voltage and a high mutual conductance.

Combining the above experimental examples and other simulation data, it was found that the preferable thickness of the high-concentration doped layers (δ doped layers) when a SiC layer is used is at least one monolayer (about 10 Angstroms) and less than 20 nm. Additionally, it is preferable that the thickness of the low-concentration doped layers (includes undoped layers) is at least approximately 10 nm but not more than approximately 100 nm. The thickness of these high-concentration doped layers and the low-concentration doped layers can be suitably selected according to the type and purpose of the active element (diode or transistor, for example) for which they are used.

In a case in which the semiconductor layer is other than a SiC layer, such as a GaAs layer, AlGaAs layer, GaN layer, AlGaN layer, SiGe layer, or SiGeC layer, the appropriate thickness of the high-concentration doped layers (δ doped layers) is determined according to that material. For example, if a GaAs layer is used, δ doped layers of one monolayer can be provided. It can be said that ordinarily, as long as carrier supply capabilities are appropriately maintained, to increase the withstand voltage value at the same thickness, it is preferable that the thickness of the high density doped layers (δ doped layers) is as thin as possible.

INDUSTRIAL APPLICABILITY

The semiconductor device according to the present invention can be used in devices, such as Schottky diodes, MESFETs, MOSFETs, IGBTs, and DMOS devices, that are mounted in electronic devices, and in particular, in devices and power devices handling high frequency signals.

What is claimed is:

1. A semiconductor device made by providing on a substrate an active region that functions as a portion of an active element,
    wherein the active region is configured by alternately layering:
        first semiconductor layers provided in plurality which function as a carrier transit region, and
        second semiconductor layers, which are composed of δ doped layers provided in plurality, which include a higher concentration of impurities for carriers than the first semiconductor layer, and which have a thinner film thickness than the first semiconductor layers,
    wherein the first semiconductor layers and the second semiconductor layers are made of the same material,
    wherein each of the first semiconductor layers has the same thickness,
    wherein the concentration of impurities for carriers included in the second semiconductor layers is substantially constant,
    wherein the second semiconductor layers are SiC layers, and
    wherein the thickness of one of said second semiconductor layers is at least one monolayer and below 20 nm.

2. A semiconductor device made by providing on a substrate an active region that functions as a portion of an active element,
    wherein the active region is configured by alternately layering:
        first semiconductor layers provided in plurality which function as a carrier transit region, and
        second semiconductor layers, which are composed of δ doped layers provided in plurality, which include a higher concentration of impurities for carriers than the first semiconductor layers, and which have a thinner film thickness than the first semiconductor layers,
    wherein the first semiconductor layers and the second semiconductor layers are made of the same material,
    wherein each of the first semiconductor layers has the same thickness,
    wherein the concentration of impurities for carriers included in the second semiconductor layers is substantially constant,
    wherein the first semiconductor layers are SiC layers, and
    wherein the thickness of one of said first semiconductor layers is at least about 10 nm and at most about 100 nm.

3. A semiconductor device made by providing on a substrate an active region that functions as a portion of an active element,
    wherein the active region is configured by alternately layering:
        first semiconductor layers provided in plurality which function as a carrier transit region, and
        second semiconductor layers, which are composed of δ doped layers provided in plurality, which include a higher concentration of impurities for carriers than the first semiconductor layers, and which have a thinner film thickness than the first semiconductor layers,
    wherein the first semiconductor layers and the second semiconductor layers are made of the same material,
    wherein each of the first semiconductor layers has the same thickness,
    wherein the concentration of impurities for carriers included in the second semiconductor layers is substantially constant, and
    wherein the semiconductor device further comprises a Schottky electrode providing a Schottky contact with a first lateral face of the first semiconductor layers and of the second semiconductor layers of the active region, and
    an electrode that is connected to a second lateral face of the first semiconductor layers and of the second semiconductor layers of the active region, the second lateral face being arranged at a certain spacing from the first lateral face.

4. The semiconductor device according to claim 3, further comprising a doped layer for connecting lead, which is formed by introducing a high concentration of impurities into a region of the active region that is at a certain spacing from the first lateral face of the first semiconductor layers and the second semiconductor layers, and wherein the electrode is in ohmic contact with the doped layer for connecting lead.

* * * * *